United States Patent
Schaefer et al.

(10) Patent No.: US 11,789,818 B2
(45) Date of Patent: Oct. 17, 2023

(54) COORDINATED ERROR CORRECTION

(71) Applicant: Micron Technology, Inc., Boise, ID (US)

(72) Inventors: Scott E. Schaefer, Boise, ID (US); Aaron P. Boehm, Boise, ID (US)

( * ) Notice: Subject to any disclaimer, the term of this patent is extended or adjusted under 35 U.S.C. 154(b) by 0 days.

(21) Appl. No.: 17/690,772

(22) Filed: Mar. 9, 2022

(65) Prior Publication Data

US 2022/0197745 A1 Jun. 23, 2022

Related U.S. Application Data

(63) Continuation of application No. 16/940,783, filed on Jul. 28, 2020, now Pat. No. 11,294,766.

(60) Provisional application No. 62/885,925, filed on Aug. 13, 2019.

(51) Int. Cl.
G06F 11/10 (2006.01)
H03M 13/29 (2006.01)

(52) U.S. Cl.
CPC ..... *G06F 11/1076* (2013.01); *H03M 13/2906* (2013.01)

(58) Field of Classification Search
None
See application file for complete search history.

(56) References Cited

U.S. PATENT DOCUMENTS 8,694,855 B1 * 4/2014 Micheloni ........... G06F 11/1048
714/763
9,495,232 B2 * 11/2016 Gjorup .................. G06F 11/076
2003/0066010 A1 * 4/2003 Acton .................... H03M 13/19
2006/0048031 A1 * 3/2006 Aadsen ............... G06F 11/1008
714/E11.034
2010/0083065 A1 * 4/2010 Longwell .............. G06F 11/106
714/E11.034
2010/0180182 A1 * 7/2010 Trantham ............ G06F 11/1068
714/799
2011/0041005 A1 * 2/2011 Selinger ............... G11C 29/765
714/48

(Continued)

OTHER PUBLICATIONS

P. Subedi, P. Huang, X. He, M. Zhang and J. Han, "A hybrid erasure-coded ECC scheme to improve performance and reliability of solid state drives," 2014 IEEE 33rd International Performance Computing and Communications Conference (IPCCC), Austin, TX, USA, 2014, pp. 1-8, doi: 10.1109/PCCC.2014.7017095. (Year: 2014).*

(Continued)

*Primary Examiner* — Daniel F. McMahon
(74) *Attorney, Agent, or Firm* — Holland & Hart LLP

(57) ABSTRACT

Methods, systems, and devices for coordinated error correction are described. A memory device indicates, to an external device, that errors were detected in data that was stored by the memory device and requested by the external device based on a comparison between an error correction code stored when the data was written to a memory array and an error correction code generated when the data is read from the memory array. Based on a result of the comparison, an indication of whether the compared error correction codes match is provided to the external device. The external device uses the indication to detect errors in the received version of the data, to manage data storage in the memory device, or both.

20 Claims, 10 Drawing Sheets

(56) References Cited

U.S. PATENT DOCUMENTS

| | | | | |
|---|---|---|---|---|
| 2011/0307758 | A1* | 12/2011 | Fillingim | G06F 11/1048 |
| | | | | 714/E11.03 |
| 2013/0179751 | A1* | 7/2013 | Linstadt | G06F 11/10 |
| | | | | 714/763 |
| 2014/0245098 | A1* | 8/2014 | Sharon | G06F 11/1012 |
| | | | | 714/755 |
| 2016/0092306 | A1* | 3/2016 | Benedict | G06F 11/1076 |
| | | | | 714/764 |
| 2017/0160946 | A1* | 6/2017 | Kodera | G06F 13/4282 |
| 2017/0192721 | A1* | 7/2017 | Chung | G06F 3/0604 |
| 2019/0042369 | A1* | 2/2019 | Deutsch | G06F 3/0673 |
| 2020/0117540 | A1* | 4/2020 | Boehm | G06F 12/1425 |
| 2021/0049068 | A1 | 2/2021 | Schaefer et al. | |

OTHER PUBLICATIONS

ISA/KR, International Search Report and Written Opinion of the International Searching Authority, Int'l Appl. No. PCT/US2020/044034, Nov. 3, 2020, Korean IntellectualProperty Office, Seo-gu, Daejeon, Republic of Korea, 13pgs.

Cai et al., "Error Characterization, Mitigation, and Recovery in Flash-Memory-Based Solid-State Drives", Proceedings of the IEEE, Sep. 2017, pp. 1666-1704, vol. 105, No. 9.

T. Bates and C. P. Bridges, "Single event mitigation for Xilinx 7-series FPGAs," 2018 IEEE Aerospace Conference, 2018, pp. 1-12, doi 10.1109/AER0.2018.8396520. (Year: 2018).

* cited by examiner

COORDINATED ERROR CORRECTION

CROSS REFERENCE

The present Application for Patent is a continuation of U.S. patent application Ser. No. 16/940,783 by SCHAEFER et al., entitled "COORDINATED ERROR CORRECTION," filed Jul. 28, 2020, which claims the benefit of U.S. Provisional Patent Application No. 62/885,925 by SCHAEFER et al., entitled "COORDINATED ERROR CORRECTION," filed Aug. 13, 2019, each of which is assigned to the assignee hereof, and each of which is expressly incorporated by reference herein.

BACKGROUND

The following relates generally to a system that includes at least one memory device and more specifically to extended error detection for a memory device.

Memory devices are widely used to store information in various electronic devices such as computers, wireless communication devices, cameras, digital displays, and the like. Information is stored by programing different states of a memory device. For example, binary devices most often store one of two states, often denoted by a logic 1 or a logic 0. In other devices, more than two states may be stored. To access the stored information, a component of the device may read, or sense, at least one stored state in the memory device. To store information, a component of the device may write, or program, the state in the memory device.

Various types of memory devices exist, including magnetic hard disks, random access memory (RAM), read only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Non-volatile memory, e.g., FeRAM, may maintain their stored logic state for extended periods of time even in the absence of an external power source. Volatile memory devices, e.g., DRAM, may lose their stored state when disconnected from an external power source.

In some cases, data stored within a memory device may become corrupted. Some memory devices may be configured to internally detect or correct such data corruption or errors (e.g., data errors) and thereby recover the data as stored before corruption.

DETAILED DESCRIPTION

Figure 1:
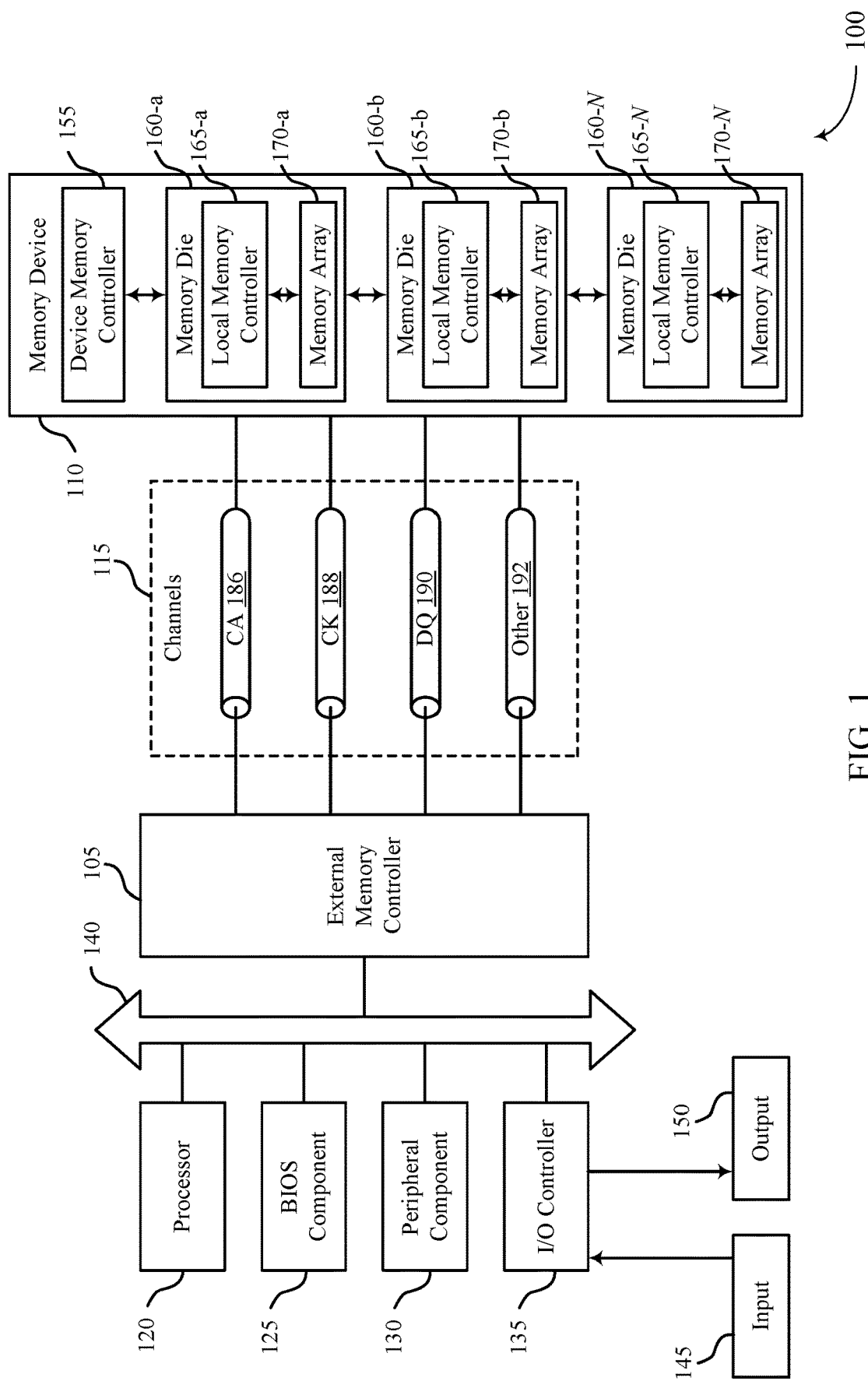
FIG. 1 illustrates an example of a system that coordinated error correction as disclosed herein.

Memory devices may operate under various conditions as part of electronic apparatuses such as personal computers, wireless communication devices, servers, internet-of-things (IoT) devices, electronic components of automotive vehicles, and the like. In some cases, memory devices supporting applications for certain implementations (e.g., automotive vehicles, in some cases with autonomous or semi-autonomous driving capabilities) may be subject to increased reliability constraints. As such, memory devices (e.g., DRAM) for some applications may be expected to operate with a reliability subject to relatively higher industry standards or specifications (e.g., higher reliability constraints).

In some cases, memory devices may use error detection/correction techniques to increase the reliability of stored data. Some error detection/correction techniques used at memory devices include single-bit error (SBE) correction (SEC) techniques, double-bit error (DBE) detection (DED) techniques, and SECDED techniques. In some cases, an external device that stores data in a memory device (e.g., a host device) may also use internal error detection/correction techniques to confirm the reliability of data received from memory.

In some cases, the error detection/correction techniques used at a memory device differ from those used at a host device. For example, a host device that operates in a safety critical environment (e.g., automotive, aviation, etc.) may use a more robust error detection/correction technique than a memory device. In some scenarios, the use of different error detection/correction techniques at the host device versus the memory device may in some cases give rise to additional errors. For example, if a memory device applies an SEC technique to requested data that contains two or more bit errors, the memory device may improperly flip a correct bit of the requested data, increasing the quantity of bit errors in the data from two bit errors to three bit errors. Accordingly, a host device using SECDED techniques may be unable to detect and/or correctly identify the bit errors in received data when the memory device transmits the data with three bit errors, while the host device would have been able to detect the two original bit errors.

Thus, more generally, when errors in a set of data read from the memory device are more numerous than an on-die ECC scheme at the memory device may properly handle (e.g., detect and/or correct), the on-die ECC scheme may introduce one or more additional errors, which may result in the set of data (as sent to the host device) including a total quantity of errors more numerous than the ECC scheme at the host may properly handle—in some cases where the ECC at the host device would have been capable of properly handling the initial quantity of errors (prior to the on-die ECC scheme being applied to the data).

In accordance with the techniques described herein, to increase the reliability of data transfers between a memory device and host device, the memory device may indicate to the host device when the memory device detected an error included in or otherwise associated with requested data (e.g., an error in the data, an error in parity bits associated with the data). By receiving an indication that an error was detected at the memory device, the host device may avoid using data that includes a quantity of errors that would otherwise exceed the capability of the technique used by the host device—e.g., a host device using SECDED techniques may avoid using data that includes three-bit errors. Also, the host device may take subsequent action based on receiving an indication of whether an error was detected in requested data. For example, the host device may prohibit the memory device from storing data in certain memory locations that persistently store corrupted data. In other examples, the host device may refrain from performing error detection if the memory device indicates that no errors were detected in the requested data, thereby improving efficiency of the host device. In yet other examples, the memory locations may be used to perform a targeted "scrubbing" procedure during which data stored in pages associated previously identified data errors (e.g., since the last scrubbing procedure, or ever) are read and rewritten with corrected (via the on-die ECC) versions of the stored data, and pages not associated with such previously identified data errors are skipped during the scrubbing procedure.

Features of the disclosure are initially described in the context of a memory system. Features of the disclosure are further described below in the context of syndrome match checkers and memory subsystems that support coordinated error correction. These and other features of the disclosure are further illustrated by and described with reference to apparatus diagrams, system diagrams, and flowcharts that relate to coordinated error correction.

FIG. 1 illustrates an example of a system 100 that utilizes one or more memory devices in accordance with examples as disclosed herein. The system 100 may include an external memory controller 105, a memory device 110, and a plurality of channels 115 coupling the external memory controller 105 with the memory device 110. The system 100 may include one or more memory devices, but for ease of description the one or more memory devices may be described as a single memory device 110.

The system 100 may include aspects of an electronic device, such as a computing device, a mobile computing device, a wireless device, or a graphics processing device. The system 100 may be an example of a portable electronic device. The system 100 may be an example of a computer, a laptop computer, a tablet computer, a smartphone, a cellular phone, a wearable device, an internet-connected device, or the like. The memory device 110 may be component of the system configured to store data for one or more other components of the system 100. In some examples, the system 100 is configured for bi-directional wireless communication with other systems or devices using a base station or access point. In some examples, the system 100 is capable of machine-type communication (MTC), machine-to-machine (M2M) communication, or device-to-device (D2D) communication.

At least portions of the system 100 may be examples of a host device. Such a host device may be an example of a device that uses memory to execute processes such as a computing device, a mobile computing device, a wireless device, a graphics processing device, a computer, a laptop computer, a tablet computer, a smartphone, a cellular phone, a wearable device, an internet-connected device, some other stationary or portable electronic device, or the like. In some cases, the host device may refer to the hardware, firmware, software, or a combination thereof that implements the functions of the external memory controller 105. In some cases, the external memory controller 105 may be referred to as a host or host device. In some examples, system 100 is a graphics card.

In some cases, a memory device 110 may be an independent device or component that is configured to be in communication with other components of the system 100 and provide physical memory addresses/space to potentially be used or referenced by the system 100. In some examples, a memory device 110 is configurable to work with at least one or a plurality of different types of systems 100. Signaling between the components of the system 100 and the memory device 110 may be operable to support modulation schemes to modulate the signals, different pin designs for communicating the signals, distinct packaging of the system 100 and the memory device 110, clock signaling and synchronization between the system 100 and the memory device 110, timing conventions, and/or other factors.

The memory device 110 may be configured to store data for the components of the system 100. In some cases, the memory device 110 may act as a slave-type device to the system 100 (e.g., responding to and executing commands provided by the system 100 through the external memory controller 105). Such commands may include an access command for an access operation, such as a write command for a write operation, a read command for a read operation, a refresh command for a refresh operation, or other commands. The memory device 110 may include two or more memory dice 160 (e.g., memory chips) to support a desired or specified capacity for data storage. The memory device 110 including two or more memory dice may be referred to as a multi-die memory or package (also referred to as multi-chip memory or package).

The system 100 may further include a processor 120, a basic input/output system (BIOS) component 125, one or more peripheral components 130, and an input/output (I/O) controller 135. The components of system 100 may be in electronic communication with one another using a bus 140.

The processor 120 may be configured to control at least portions of the system 100. The processor 120 may be a general-purpose processor, a digital signal processor (DSP), an application-specific integrated circuit (ASIC), a field-programmable gate array (FPGA) or other programmable logic device, discrete gate or transistor logic, discrete hardware components, or it may be a combination of these types of components. In such cases, the processor 120 may be an example of a central processing unit (CPU), a graphics processing unit (GPU), a general purpose GPU (GPGPU), or a system on a chip (SoC), among other examples.

The BIOS component 125 may be a software component that includes a BIOS operated as firmware, which may initialize and run various hardware components of the system 100. The BIOS component 125 may also manage data flow between the processor 120 and the various components of the system 100, e.g., the peripheral components 130, the I/O controller 135, etc. The BIOS component 125 may include a program or software stored in read-only memory (ROM), flash memory, or any other non-volatile memory.

The peripheral component(s) 130 may be any input device or output device, or an interface for such devices, that may be integrated into or with the system 100. Examples may include disk controllers, sound controller, graphics controller, Ethernet controller, modem, universal serial bus (USB) controller, a serial or parallel port, or peripheral card slots, such as peripheral component interconnect (PCI) or specialized graphics ports. The peripheral component(s) 130 may be other components understood by those skilled in the art as peripherals.

The I/O controller 135 may manage data communication between the processor 120 and the peripheral component(s) 130, input devices 145, or output devices 150. The I/O controller 135 may manage peripherals that are not integrated into or with the system 100. In some cases, the I/O controller 135 may represent a physical connection or port to external peripheral components.

The input 145 may represent a device or signal external to the system 100 that provides information, signals, or data to the system 100 or its components. This may include a user interface or interface with or between other devices. In some cases, the input 145 may be a peripheral that interfaces with system 100 via one or more peripheral components 130 or may be managed by the I/O controller 135.

The output 150 may represent a device or signal external to the system 100 configured to receive an output from the system 100 or any of its components. Examples of the output 150 may include a display, audio speakers, a printing device, or another processor on printed circuit board, and so forth. In some cases, the output 150 may be a peripheral that interfaces with the system 100 via one or more peripheral components 130 or may be managed by the I/O controller 135.

The components of system 100 may be made up of general-purpose or special purpose circuitry designed to carry out their functions. This may include various circuit elements, for example, conductive lines, transistors, capacitors, inductors, resistors, amplifiers, or other active or passive elements, configured to carry out the functions described herein.

The memory device 110 may include a device memory controller 155 and one or more memory dice 160. Each memory die 160 may include a local memory controller 165 (e.g., local memory controller 165-*a*, local memory controller 165-*b*, and/or local memory controller 165-N) and a memory array 170 (e.g., memory array 170-*a*, memory array 170-*b*, and/or memory array 170-N). A memory array 170 may be a collection (e.g., a grid) of memory cells, with each memory cell being configured to store at least one bit of digital data. Features of memory arrays 170 and/or memory cells are described in more detail with reference to FIG. 2.

The memory device 110 may be an example of a two-dimensional (2D) array of memory cells or may be an example of a three-dimensional (3D) array of memory cells. For example, a 2D memory device may include a single memory die 160. A 3D memory device may include two or more memory dice 160 (e.g., memory die 160-*a*, memory die 160-*b*, and/or any quantity of memory dice 160-N). In a 3D memory device, a plurality of memory dice 160-N may be stacked on top of one another or next to one another. In some cases, memory dice 160-N in a 3D memory device may be referred to as decks, levels, layers, or dies. A 3D memory device may include any quantity of stacked memory dice 160-N (e.g., two high, three high, four high, five high, six high, seven high, eight high). This may increase the quantity of memory cells that may be positioned on a substrate as compared with a single 2D memory device, which in turn may reduce production costs or increase the performance of the memory array, or both. In some 3D memory device, different decks may share at least one common access line such that some decks may share at least one of a word line, a digit line, and/or a plate line.

The device memory controller 155 may include circuits or components configured to control operation of the memory device 110. As such, the device memory controller 155 may include the hardware, firmware, and software that enables the memory device 110 to perform commands and may be configured to receive, transmit, or execute commands, data, or control information related to the memory device 110. The device memory controller 155 may be configured to communicate with the external memory controller 105, the one or more memory dice 160, or the processor 120. In some cases, the memory device 110 may receive data and/or commands from the external memory controller 105. For example, the memory device 110 may receive a write command indicating that the memory device 110 is to store certain data on behalf of a component of the system 100 (e.g., the processor 120) or a read command indicating that the memory device 110 is to provide certain data stored in a memory die 160 to a component of the system 100 (e.g., the processor 120). In some cases, the device memory controller 155 may control operation of the memory device 110 described herein in conjunction with the local memory controller 165 of the memory die 160. Examples of the components included in the device memory controller 155 and/or the local memory controllers 165 may include receivers for demodulating signals received from the external memory controller 105, decoders for modulating and transmitting signals to the external memory controller 105, logic, decoders, amplifiers, filters, or the like.

The local memory controller 165 (e.g., local to a memory die 160) may be configured to control operations of the memory die 160. Also, the local memory controller 165 may be configured to communicate (e.g., receive and transmit data and/or commands) with the device memory controller 155. The local memory controller 165 may support the device memory controller 155 to control operation of the memory device 110 as described herein. In some cases, the memory device 110 does not include the device memory controller 155, and the local memory controller 165 or the external memory controller 105 may perform the various functions described herein. As such, the local memory controller 165 may be configured to communicate with the device memory controller 155, with other local memory controllers 165, or directly with the external memory controller 105 or the processor 120.

The external memory controller 105 may be configured to enable communication of information, data, and/or commands between components of the system 100 (e.g., the processor 120) and the memory device 110. The external memory controller 105 may act as a liaison between the components of the system 100 and the memory device 110 so that the components of the system 100 may not need to know the details of the memory device's operation. The components of the system 100 may present requests to the external memory controller 105 (e.g., read commands or write commands) that the external memory controller 105 satisfies. The external memory controller 105 may convert or translate communications exchanged between the components of the system 100 and the memory device 110. In some cases, the external memory controller 105 may include a system clock that generates a common (source) system clock signal. In some cases, the external memory controller 105 may include a common data clock that generates a common (source) data clock signal.

In some cases, the external memory controller 105 or other component of the system 100, or its functions described herein, may be implemented by the processor 120. For example, the external memory controller 105 may be hardware, firmware, or software, or some combination thereof implemented by the processor 120 or other component of the system 100. While the external memory controller 105 is depicted as being external to the memory device 110, in some cases, the external memory controller 105, or its functions described herein, may be implemented by a memory device 110. For example, the external memory controller 105 may be hardware, firmware, or software, or some combination thereof implemented by the device memory controller 155 or one or more local memory controllers 165. In some cases, the external memory controller 105 may be distributed across the processor 120 and the memory device 110 such that portions of the external memory controller 105 are implemented by the processor 120 and other portions are implemented by a device memory controller 155 or a local memory controller 165. Likewise, in some cases, one or more functions ascribed herein to the device memory controller 155 or local memory controller 165 may in some cases be performed by the external memory controller 105 (either separate from or as included in the processor 120).

The components of the system 100 may exchange information with the memory device 110 using a plurality of channels 115. In some examples, the channels 115 enable communications between the external memory controller 105 and the memory device 110. Each channel 115 may include one or more signal paths or transmission mediums (e.g., conductors) between terminals associated with the components of system 100. For example, a channel 115 may include a first terminal including one or more pins or pads at external memory controller 105 and one or more pins or pads at the memory device 110. A pin may be an example of a conductive input or output point of a device of the system 100, and a pin may be configured to act as part of a channel.

In some cases, a pin or pad of a terminal may be part of to a signal path of the channel 115. Additional signal paths may be coupled with a terminal of a channel for routing signals within a component of the system 100. For example, the memory device 110 may include signal paths (e.g., signal paths internal to the memory device 110 or its components, such as internal to a memory die 160) that route a signal from a terminal of a channel 115 to the various components of the memory device 110 (e.g., a device memory controller 155, memory dice 160, local memory controllers 165, memory arrays 170).

Channels 115 (and associated signal paths and terminals) may be dedicated to communicating specific types of information. In some cases, a channel 115 may be an aggregated channel and thus may include multiple individual channels. For example, a data channel 190 may be x4 (e.g., including four signal paths), x8 (e.g., including eight signal paths), x16 (including sixteen signal paths), and so forth. Signals communicated over the channels may use double data rate (DDR) signaling. For example, some symbols of a signal may be registered on a rising edge of a clock signal and other symbols of the signal may be registered on a falling edge of the clock signal. Signals communicated over channels may use single data rate (SDR) signaling. For example, one symbol of the signal may be registered for each clock cycle.

In some cases, the channels 115 may include one or more command and address (CA) channels 186. The CA channels 186 may be configured to communicate commands between the external memory controller 105 and the memory device 110 including control information associated with the commands (e.g., address information). For example, the CA channel 186 may include a read command with an address of the desired data. In some cases, the CA channels 186 may be registered on a rising clock signal edge and/or a falling clock signal edge. In some cases, a CA channel 186 may include any quantity of signal paths to decode address and command data (e.g., eight or nine signal paths).

In some cases, the channels 115 may include one or more clock signal (CK) channels 188. The CK channels 188 may be configured to communicate one or more common clock signals between the external memory controller 105 and the memory device 110. Each clock signal may be configured to oscillate between a high state and a low state and coordinate the actions of the external memory controller 105 and the memory device 110. In some cases, the clock signal may be a differential output (e.g., a CK_t signal and a CK_c signal) and the signal paths of the CK channels 188 may be configured accordingly. In some cases, the clock signal may be single ended. A CK channel 188 may include any quantity of signal paths. In some cases, the clock signal CK (e.g., a CK_t signal and a CK_c signal) may provide a timing reference for command and addressing operations for the memory device 110, or other system-wide operations for the memory device 110. The clock signal CK therefore may be variously referred to as a control clock signal CK, a command clock signal CK, or a system clock signal CK. The system clock signal CK may be generated by a system clock, which may include one or more hardware components (e.g., oscillators, crystals, logic gates, transistors, or the like).

In some cases, the channels 115 may include one or more data (DQ) channels 190. The data channels 190 may be configured to communicate data and/or control information between the external memory controller 105 and the memory device 110. For example, the data channels 190 may communicate information (e.g., bi-directional) to be written to the memory device 110 or information read from the memory device 110. In some cases, the channels 115 may include one or more other channels 192 that may be dedicated to other purposes. These other channels 192 may include any quantity of signal paths.

In some cases, the other channels 192 may include one or more write clock signal (WCK) channels. While the 'W' in WCK may nominally stand for "write," a write clock signal WCK (e.g., a WCK_t signal and a WCK_c signal) may provide a timing reference for access operations generally for the memory device 110 (e.g., a timing reference for both read and write operations). Accordingly, the write clock signal WCK may also be referred to as a data clock signal WCK. The WCK channels may be configured to communicate a common data clock signal between the external memory controller 105 and the memory device 110. The data clock signal may be configured to coordinate an access operation (e.g., a write operation or read operation) of the external memory controller 105 and the memory device 110. In some cases, the write clock signal may be a differential output (e.g., a WCK_t signal and a WCK_c signal) and the signal paths of the WCK channels may be configured accordingly. A WCK channel may include any quantity of signal paths. The data clock signal WCK may be generated by a data clock, which may include one or more hardware components (e.g., oscillators, crystals, logic gates, transistors, or the like).

In some cases, one of the other channels 192 may be configured to carry an indicator of detected and/or corrected errors associated with data of a read operation, or other activity of an ECC system within the memory device 110. In some cases, such an indicator may be carried by one or more other channels 115 (e.g., one or more DQ channels 190 or CA channels 186). The memory device 110 may perform an error detection operation on the data read from a memory array 170. The error detection operation may detect single-bit errors, double-bit errors, and errors that impact more than two bits. The memory device 110 may use parity information to perform the error detection procedure to detect and/or correct errors within data retrieved from the memory array 170 during the read operation. In some cases, the memory device 110 may associate each bit of the data read during the read operation with two or more bits of parity information. For example, the memory device 110 may use two or more sets of parity bits to detect errors within a matrix of the data. Each set of parity bits may correspond to a dimension of the matrix of data. Thus, each bit of the data within the matrix may be associated with two or more parity bits corresponding to the parity dimensions. The memory device 110 may output an indicator of the detected and/or corrected error by the other channels 192. The indicator may include a flag indicating a detected error. Additionally, or alternatively, the indicator may include an indication of a type of error detected or corrected within the data read from the memory array 170. In some other cases, the indicator may be communicated over the DQ channels 190.

In some cases, the other channels 192 may include one or more error correction code (EDC) channels. The EDC channels may be configured to communicate error detection signals, such as checksums, to improve system reliability. An EDC channel may include any quantity of signal paths.

The channels 115 may couple the external memory controller 105 with the memory device 110 using a variety of different architectures. Examples of the various architectures may include a bus, a point-to-point connection, a crossbar, a high-density interposer such as a silicon interposer, or channels formed in an organic substrate or some combination thereof. For example, in some cases, the signal paths may at least partially include a high-density interposer, such as a silicon interposer or a glass interposer.

Signals communicated over the channels 115 may be modulated using a variety of different modulation schemes. In some cases, a binary-symbol (or binary-level) modulation scheme may be used to modulate signals communicated between the external memory controller 105 and the memory device 110. A binary-symbol modulation scheme may be an example of a M-ary modulation scheme where M is equal to two. Each symbol of a binary-symbol modulation scheme may be configured to represent one bit of digital data (e.g., a symbol may represent a logic 1 or a logic 0). Examples of binary-symbol modulation schemes include, but are not limited to, non-return-to-zero (NRZ), unipolar encoding, bipolar encoding, Manchester encoding, pulse amplitude modulation (PAM) having two symbols (e.g., PAM2), and/or others.

In some cases, a multi-symbol (or multi-level) modulation scheme may be used to modulate signals communicated between the external memory controller 105 and the memory device 110. A multi-symbol modulation scheme may be an example of a M-ary modulation scheme where M is greater than or equal to three. Each symbol of a multi-symbol modulation scheme may be configured to represent more than one bit of digital data (e.g., a symbol may represent a logic 00, a logic 01, a logic 10, or a logic 11). Examples of multi-symbol modulation schemes include, but are not limited to, PAM4, PAM8, etc., quadrature amplitude modulation (QAM), quadrature phase shift keying (QPSK), and/or others. A multi-symbol signal or a PAM4 signal may be a signal that is modulated using a modulation scheme that includes at least three levels to encode more than one bit of information. Multi-symbol modulation schemes and symbols may alternatively be referred to as non-binary, multi-bit, or higher-order modulation schemes and symbols.

The memory device 110 may support an internal (e.g., on-die) ECC scheme configured to detect and in at least some cases correct errors in data read from a memory array 170. Further, the memory device 110 may indicate to the external memory controller 105 when ECC scheme at the memory device 110 has detected an error associate with a set of data (e.g., by sending signaling that conveys the indication concurrent with sending the set of data, or by storing the indication so that the external memory controller 105 may later poll the memory device 110 for the indication or the memory device 110 may later include the indication in an error report).

Figure 2:
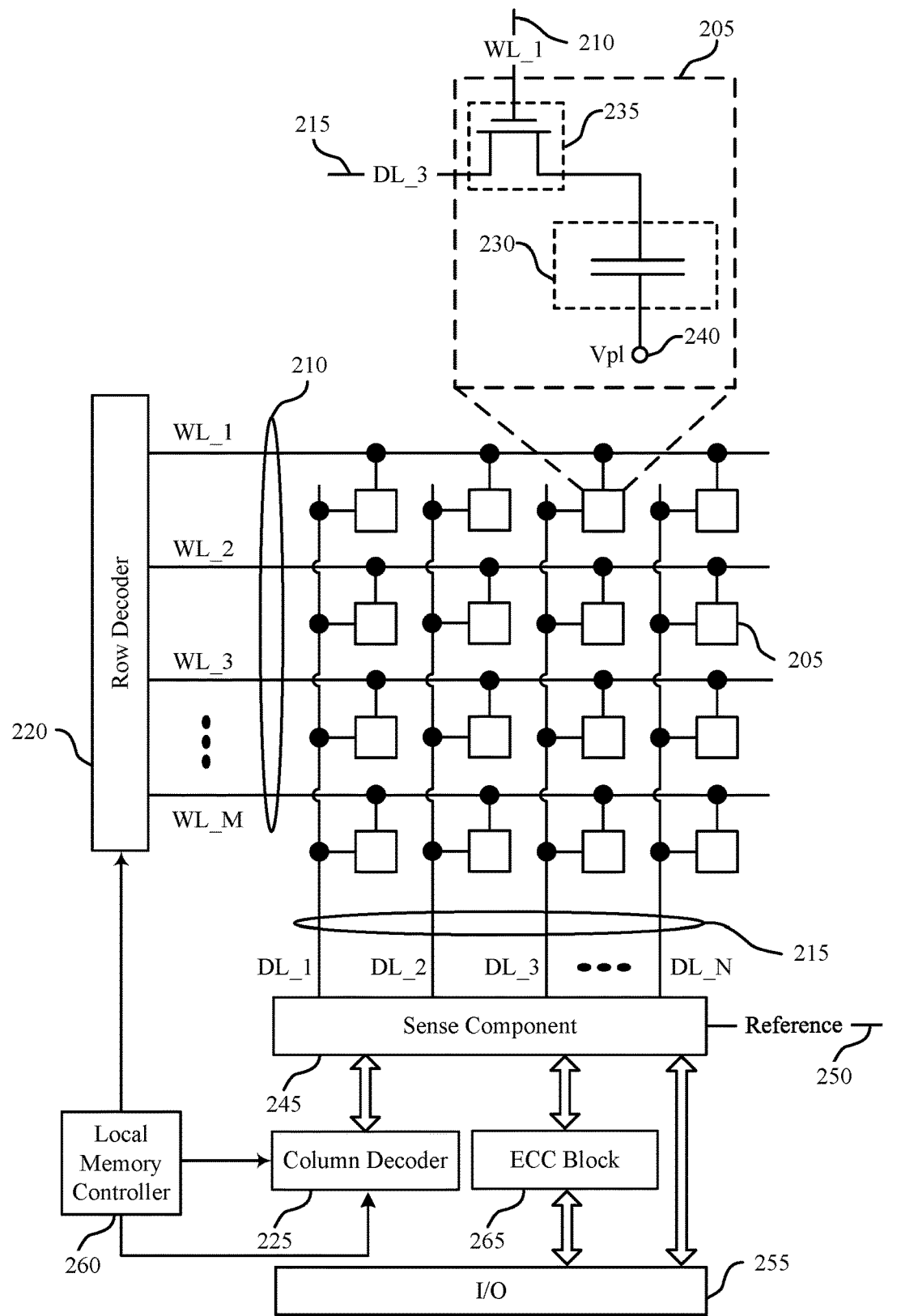
FIG. 2 illustrates an example of a memory die that coordinated error correction as disclosed herein.

FIG. 2 illustrates an example of a memory die 200 in accordance with examples as disclosed herein. The memory die 200 may be an example of the memory dice 160 described with reference to FIG. 1. In some cases, the memory die 200 may be referred to as a memory chip, a memory device, or an electronic memory apparatus. The memory die 200 may include one or more memory cells 205 that are programmable to store different logic states. Each memory cell 205 may be programmable to store two or more states. For example, the memory cell 205 may be configured to store one bit of digital logic at a time (e.g., a logic 0 and a logic 1). In some cases, a single memory cell 205 (e.g., a multi-level memory cell) may be configured to store more than one bit of digit logic at a time (e.g., a logic 00, logic 01, logic 10, or a logic 11).

A memory cell 205 may store a charge representative of the programmable states in a capacitor. DRAM architectures may include a capacitor that includes a dielectric material to store a charge representative of the programmable state. In other memory architectures, other storage devices and components are possible. For example, nonlinear dielectric materials may be employed.

Operations such as reading and writing may be performed on memory cells 205 by activating or selecting access lines such as a word line 210 and/or a digit line 215. In some cases, digit lines 215 may also be referred to as bit lines. References to access lines, word lines and digit lines, or their analogues, are interchangeable without loss of understanding or operation. Activating or selecting a word line 210 or a digit line 215 may include applying a voltage to the respective line.

The memory die 200 may include the access lines (e.g., the word lines 210 and the digit lines 215) arranged in a grid-like pattern. Memory cells 205 may be positioned at intersections of the word lines 210 and the digit lines 215. By biasing a word line 210 and a digit line 215 (e.g., applying a voltage to the word line 210 or the digit line 215), a single memory cell 205 may be accessed at their intersection.

Accessing the memory cells 205 may be controlled through a row decoder 220 or a column decoder 225. For example, a row decoder 220 may receive a row address from the local memory controller 260 and activate a word line 210 based on the received row address. A column decoder 225 may receive a column address from the local memory controller 260 and may activate a digit line 215 based on the received column address. For example, the memory die 200 may include multiple word lines 210, labeled WL_1 through WL_M, and multiple digit lines 215, labeled DL_1 through DL_N, where M and N depend on the size of the memory array. Thus, by activating a word line 210 and a digit line 215, e.g., WL_1 and DL_3, the memory cell 205 at their intersection may be accessed. The intersection of a word line 210 and a digit line 215, in either a two-dimensional or three-dimensional configuration, may be referred to as an address of a memory cell 205.

The memory cell 205 may include a logic storage component, such as capacitor 230 and a switching component 235. The capacitor 230 may be an example of a dielectric capacitor or a ferroelectric capacitor. A first node of the capacitor 230 may be coupled with the switching component 235 and a second node of the capacitor 230 may be coupled with a voltage source 240. In some cases, the voltage source 240 may be the cell plate reference voltage, such as Vpl, or may be ground, such as Vss. In some cases, the voltage source 240 may be an example of a plate line coupled with a plate line driver. The switching component 235 may be an example of a transistor or any other type of switch device that selectively establishes or de-establishes electronic communication between two components.

Selecting or deselecting the memory cell 205 may be accomplished by activating or deactivating the switching component 235. The capacitor 230 may be in electronic communication with the digit line 215 using the switching component 235. For example, the capacitor 230 may be isolated from digit line 215 when the switching component 235 is deactivated, and the capacitor 230 may be coupled with digit line 215 when the switching component 235 is activated. In some cases, the switching component 235 is a transistor and its operation may be controlled by applying a voltage to the transistor gate, where the voltage differential between the transistor gate and transistor source may be greater or less than a threshold voltage of the transistor. In some cases, the switching component 235 may be a p-type transistor or an n-type transistor. The word line 210 may be in electronic communication with the gate of the switching component 235 and may activate/deactivate the switching component 235 based on a voltage being applied to word line 210.

A word line 210 may be a conductive line in electronic communication with a memory cell 205 that is used to perform access operations on the memory cell 205. In some architectures, the word line 210 may be in electronic communication with a gate of a switching component 235 of a memory cell 205 and may be configured to control the switching component 235 of the memory cell. In some architectures, the word line 210 may be in electronic communication with a node of the capacitor of the memory cell 205 and the memory cell 205 may not include a switching component.

A digit line 215 may be a conductive line that connects the memory cell 205 with a sense component 245. In some architectures, the memory cell 205 may be selectively coupled with the digit line 215 during portions of an access operation. For example, the word line 210 and the switching component 235 of the memory cell 205 may be configured to couple and/or isolate the capacitor 230 of the memory cell 205 and the digit line 215. In some architectures, the memory cell 205 may be in electronic communication (e.g., constant) with the digit line 215.

The sense component 245 may be configured to detect a state (e.g., a charge) stored on the capacitor 230 of the memory cell 205 and determine a logic state of the memory cell 205 based on the stored state. The charge stored by a memory cell 205 may be extremely small, in some cases. As such, the sense component 245 may include one or more sense amplifiers to amplify the signal output by the memory cell 205. The sense amplifiers may detect small changes in the charge of a digit line 215 during a read operation and may produce signals corresponding to a logic state 0 or a logic state 1 based on the detected charge. During a read operation, the capacitor 230 of memory cell 205 may output a signal (e.g., discharge a charge) to its corresponding digit line 215. The signal may cause a voltage of the digit line 215 to change. The sense component 245 may be configured to compare the signal received from the memory cell 205 across the digit line 215 to a reference signal 250 (e.g., reference voltage). The sense component 245 may determine the stored state of the memory cell 205 based on the comparison. For example, in binary-signaling, if digit line 215 has a higher voltage than the reference signal 250, the sense component 245 may determine that the stored state of memory cell 205 is a logic 1 and, if the digit line 215 has a lower voltage than the reference signal 250, the sense component 245 may determine that the stored state of the memory cell 205 is a logic 0.

The sense component 245 may include various transistors or amplifiers to detect and amplify a difference in the signals. The detected logic state of memory cell 205 may be output through ECC block 265 by I/O 255. The ECC block 265 may perform an error correction operation on the detected logic state of memory cell 205 and output data (e.g., the stored data or corrected data) via I/O 255. In some other cases, the detected logic state of memory cell 205 may bypass ECC block 265 and be output via I/O 255. In some cases, the detected logic state of memory cell 205 may be output to both the ECC block 265 and the I/O 255. Here, the detected logic state of memory cell 205 may be output from the memory die 200 by the I/O 255 at a same time as ECC block 265 performs an error correction operation on the detected logic state of memory cell 205. In some cases, the sense component 245 may be part of another component (e.g., a column decoder 225, row decoder 220). In some cases, the sense component 245 may be in electronic communication with the row decoder 220 or the column decoder 225.

The local memory controller 260 may control the operation of memory cells 205 through the various components (e.g., row decoder 220, column decoder 225, sense component 245, and ECC block 265). The local memory controller 260 may be an example of the local memory controller 165 described with reference to FIG. 1. In some cases, one or more of the row decoder 220, column decoder 225, sense component 245, and ECC block 265 may be co-located with the local memory controller 260. The local memory controller 260 may be configured to receive commands and/or data from an external memory controller 105 (or a device memory controller 155 described with reference to FIG. 1), translate the commands and/or data into information that can be used by the memory die 200, perform one or more operations on the memory die 200, and communicate data from the memory die 200 to the external memory controller 105 (or the device memory controller 155) in response to performing the one or more operations. The local memory controller 260 may generate row and column address signals to activate the target word line 210 and the target digit line 215. The local memory controller 260 may also generate and control various voltages or currents used during the operation of the memory die 200. In general, the amplitude, shape, or duration of an applied voltage or current discussed herein may be adjusted or varied and may be different for the various operations discussed in operating the memory die 200.

In some cases, the local memory controller 260 may be configured to perform a write operation (e.g., a programming operation) on one or more memory cells 205 of the memory die 200. During a write operation, a memory cell 205 of the memory die 200 may be programmed to store a desired logic state. In some cases, a plurality of memory cells 205 may be programmed during a single write operation. The local memory controller 260 may identify a target memory cell 205 on which to perform the write operation. The local memory controller 260 may identify a target word line 210 and a target digit line 215 in electronic communication with the target memory cell 205 (e.g., the address of the target memory cell 205). The local memory controller 260 may activate the target word line 210 and the target digit line 215 (e.g., applying a voltage to the word line 210 or digit line 215), to access the target memory cell 205. The local memory controller 260 may apply a specific signal (e.g., voltage) to the digit line 215 during the write operation to store a specific state (e.g., charge) in the capacitor 230 of the memory cell 205, the specific state (e.g., charge) may be indicative of a desired logic state.

During the write operation, the ECC block 265 or the local memory controller 260 may generate error detection or correction information. For example, the ECC block 265 may receive data from the host device as part of a write operation. The ECC block 265 may determine or generate error detection or correction information associated with the data. In some cases, the ECC block 265 may include error detection logic or may cause error detection logic (not shown) to perform the error detection operations described herein. The ECC block 265 may cause the data and the error detection or correction information to be stored in one or more memory cells 205 as part of the write operation. The type of error detection or correction information generated by the ECC block 265 may correspond to a type of error detection operation performed by the ECC block 265. For example, if the ECC block 265 performs a SEC or SECDED error detection operation, the ECC block 265 may generate a SEC or SECDED codeword as part of the write operation. The SEC or SECDED codewords may correspond to error detection information used by the ECC block 265 to detect and/or correct errors within the data when performing a SEC or SECDED error detection operation respectively. Alternatively, if the ECC block 265 performs an error detection operation based on parity bits, the ECC block 265 may generate parity bits as part of the write operation.

In some cases, the local memory controller 260 may be configured to perform a read operation (e.g., a sense operation) on one or more memory cells 205 of the memory die 200. During a read operation, the logic state stored in a memory cell 205 of the memory die 200 may be determined. In some cases, a plurality of memory cells 205 may be sensed during a single read operation. The local memory controller 260 may identify a target memory cell 205 on which to perform the read operation. The local memory controller 260 may identify a target word line 210 and a target digit line 215 in electronic communication with the target memory cell 205 (e.g., the address of the target memory cell 205). The local memory controller 260 may activate the target word line 210 and the target digit line 215 (e.g., applying a voltage to the word line 210 or digit line 215), to access the target memory cell 205. The target memory cell 205 may transfer a signal to the sense component 245 in response to biasing the access lines. The sense component 245 may amplify the signal. The local memory controller 260 may fire the sense component 245 (e.g., latch the sense component) and thereby compare the signal received from the memory cell 205 to the reference signal 250. Based on that comparison, the sense component 245 may determine a logic state that is stored on the memory cell 205. The local memory controller 260 may communicate the logic state stored on the memory cell 205 to the external memory controller 105 (or the device memory controller 155) as part of the read operation.

During the read operation, the ECC block 265 may retrieve data and associated error detection or correction information from the array of memory cells 205. The ECC block 265 may perform an error correction operation based on the data and the error detection or correction information. Performing an error correction operation at the memory device (e.g., by the ECC block 265 or the local memory controller 260) may improve the reliability of the memory device. The ECC block 265 may be configured to perform a single type of error detection operation (e.g., a SEC or SECDED error detection operation, an error detection operation based on parity bits) or may be configured to perform a combination of error detection operations (e.g., an error detection operation based on parity bits and a SEC or SECDED error detection operation).

In some memory architectures, accessing the memory cell 205 may degrade or destroy the logic state stored in a memory cell 205. For example, a read operation performed in DRAM architectures may partially or completely discharge the capacitor of the target memory cell. The local memory controller 260 may perform a re-write operation or a refresh operation to return the memory cell to its original logic state. The local memory controller 260 may re-write the logic state to the target memory cell after a read operation. In some cases, the re-write operation may be considered part of the read operation. Additionally, activating a single access line, such as a word line 210, may disturb the state stored in some memory cells in electronic communication with that access line. Thus, a re-write operation or refresh operation may be performed on one or more memory cells that may not have been accessed.

Figure 3:
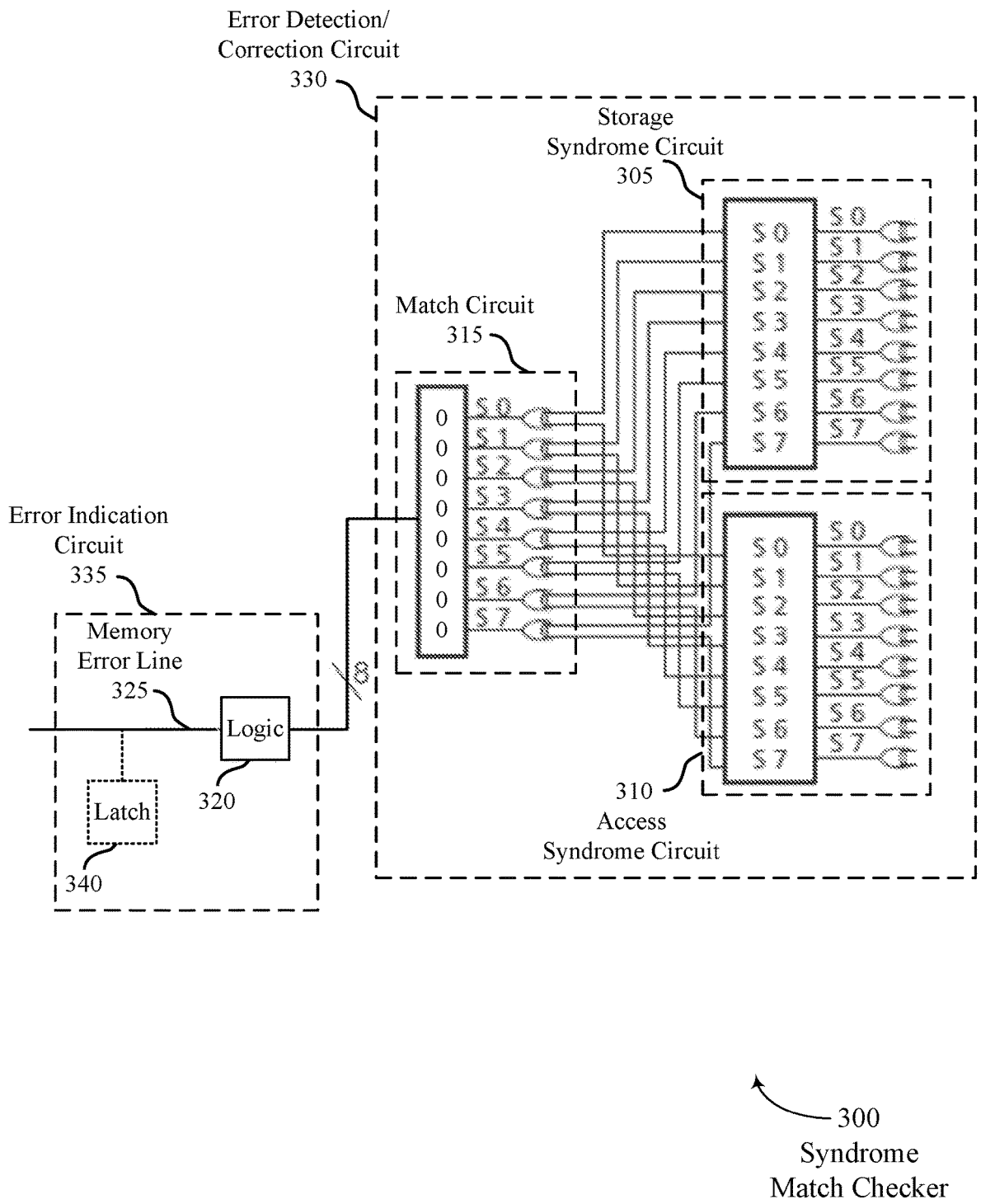
FIG. 3 illustrates an example of a syndrome match checker that supports coordinated error correction as disclosed herein.

FIG. 3 illustrates an example of a syndrome match checker that supports coordinated error correction as disclosed herein.

Syndrome match checker 300 may be configured to determine and indicate whether an on-die ECC component (e.g., error correction/detection circuit 330) detected an error associated with data stored in a memory array (e.g., an error in the data, or an error in parity bits associated with the data). Syndrome match checker 300 may include an error correction/detection circuit 330 and an error indication circuit 335.

Error correction/detection circuit 330 may be configured to detect errors in data stored in a memory cell. Error correction/detection circuit 330 may also be configured to correct errors in data by flipping a data bit that has been identified as being corrupted—e.g., changing a corrupted data bit from a "1" to a "0," or vice versa. In some cases, error correction/detection circuit 330 may be configured to detect single-bit error (SBE) in requested data and to correct single-bit errors in requested data—e.g., error correction/detection circuit 330 may be configured to use a SEC technique. In other cases, error correction/detection circuit 330 may be configured to detect double-bit errors (DBE) and to correct single-bit errors in requested data—e.g., error correction/detection circuit 330 may be configured to use a SECDED technique. In yet other cases, error correction/detection circuit 330 may be configured to detect triple-bit errors (TBE). These are examples, and error correction/detection circuit 330 may be configured to detect up to any first quantity of errors and correct up to any second quantity of errors (that may be different than or the same as the first quantity). Error correction/detection circuit 330 may be further configured to provide altered data—e.g., data that has been "corrected"—to an external device. It is to be understood that the techniques described herein may be applied to an ECC scheme configured to detect and/or correct any quantity of errors, and any specific quantities used herein are purely for the sake of illustration and are non-limiting.

Error correction/detection circuit 330 may include storage syndrome circuit 305, access syndrome circuit 310, and match circuit 315. When error correction/detection circuit 330 is configured to detect double-bit errors, storage syndrome circuit 305, access syndrome circuit 310, and match circuit 315 may each be configured to output an additional syndrome bit versus when it is configured to implement an SEC scheme.

Storage syndrome circuit 305 may be configured to generate an error correction code for data upon storage of the data within a memory array. In some cases, the error correction code generated by storage syndrome circuit 305 may be referred to as a "stored error correction code" or stored "codeword."

Access syndrome circuit 310 may be configured to generate another error correction code when data is read from the memory array—e.g., when the data stored in the memory array is requested by an external device. The error correction code generated by access syndrome circuit 310 may be referred to as a "calculated error correction code" or "calculated codeword." In some cases, access syndrome circuit 310 may use a same algorithm as storage syndrome circuit 305 to generate the calculated error correction code.

Match circuit 315 may be configured to compare the stored error correction code and the calculated error correction code. In some cases, match circuit 315 may compare the stored and calculated error correction codes by performing XOR operations on the corresponding bits of the stored and calculated error correction codes. If each bit of the stored and calculated error correction codes are the same—e.g., if the stored and calculated error correction codes match—match circuit 315 may output all zeros (as shown in FIG. 3). Otherwise if the stored and calculated error correction codes do not match, match circuit 315 may output one or more non-zero values.

In some cases, match circuit 315 may also be configured to output a location of a corrupted bit in a set of data or in an associated stored error correction code based on the comparison of the stored error correction code and the calculated error correction code. For example, when match circuit 315 outputs a non-zero value, all of the outputs of match circuit may be used to represent a position of a bit in the stored codeword that is corrupted—e.g., the outputs of match circuit 315 may represent up to 2^8 different bit positions.

Error indication circuit 335 may be configured to indicate whether error correction/detection circuit 330 detected an error in or otherwise associated with data requested from the memory array. Error indication circuit 335 may include logic circuit 320 and memory error line 325.

Logic circuit 320 may be configured to determine whether match circuit 315 is outputting any (or some other threshold quantity of) non-zero values. In some cases, logic circuit 320 determines whether match circuit 315 is outputting one or more non-zero values based on analyzing each bit output by match circuit 315. That is, logic circuit 320 may perform one or more OR operations on all of the bits output by match circuit 315. In such cases, if the output of match circuit 315 includes all zero values, logic circuit 320 may output a first signal (e.g., a virtual ground voltage) that indicates a match (or a "match signal"). And if the output of match circuit 315 includes one or more non-zero values, logic circuit 320 may output a second signal (e.g., a supply voltage) that indicates a mismatch (or a "mismatch signal").

In some cases, logic circuit 320 outputs a Boolean "false" when match circuit 315 outputs all zero values (which may be represented by a virtual ground supply voltage), indicating a match. And if the output of match circuit includes at least one non-zero value, logic circuit 320 outputs a Boolean "true" when match circuit 315, indicating a mismatch.

In other cases, if the output of match circuit 315 includes all zero values or less than some threshold quantity of non-zero values (e.g., includes a single non-zero value), logic circuit 320 outputs as "false," indicating a match or substantial match. In some cases, only one or some other quantity of non-zero values below a threshold quantity may indicate that an error occurred in the ECC bits and not in the stored data. And if the output of match circuit 315 includes a quantity of non-zero values that satisfies the threshold (e.g., two or more), logic circuit 320 outputs as "true", indicating a mismatch. In some cases, error correction/detection circuit 330 may overwrite the stored error correction code with the calculated error correction code after identifying that only one non-zero value was output by match circuit 315 and the corresponding data may be transmitted to a device that requested the data.

The output of logic circuit 320 may be signaled over memory error line 325. In some cases, the output of logic circuit 320 is signaled over memory error line 325 as a "memory syndrome flag." In some cases, the memory syndrome flag is included within a data stream—e.g., is appended to requested data. In some cases, the memory syndrome flag is signaled over a dedicated pin (e.g., concurrent with, meaning at least partially overlapping in time with, the data stream being signaled over one or more other pins).

In some cases, latch 340 may be configured to store an output of logic circuit 320, as a memory syndrome flag, which may be accessible to external devices. In some cases, the data stored at the latch is accessed when requested (e.g., polled) by an external device. In other cases, the data stored at the latch is provided to an external device during certain error reporting procedures. In some cases, the output of logic circuit 320 may be stored at latch 340 instead of being signaled to an external device over memory error line 325.

In some cases, error indication circuit 335 may be further configured to store memory addresses associated with error-corrected data. Error indication circuit 335 may output a stored memory address over memory error line 325, alone or in combination with, the memory syndrome flag. In some cases, the indicated stored memory address doubles as the memory syndrome flag—e.g., an external device may determine that an error was detected and/or corrected at error correction/detection circuit 330 based on receiving a non-zero value over memory error line 325. In some cases, the stored address is the actual address in a memory array (or a "physical address"). In other cases, the sored address is an address that differs from the physical address but is the address used by an external device to access data in a memory array (or a "logical address").

In some examples, when the ECC scheme supported by error correction/detection circuit 330 is overpowered by data including more bit errors than a maximum quantity that the ECC scheme can detect or correct, error correction/detection circuit 330 may improperly alias (e.g., flip or otherwise alter) a bit having a correct value or otherwise introduce or fail to correct an error in a set of data read from the memory array. For example, when error correction/detection circuit 330 is configured with an SEC scheme, error correction/ detection circuit 330 may detect a single-bit error in requested data that actually includes two or more bit errors. In such cases, error correction/detection circuit 330 may unsuccessfully attempt to correct the detected error by flipping an uncorrupted bit in the requested data at a bit position indicated by match circuit 315—e.g., turning a two-bit error into a three bit error (such operation may be referred to as "aliasing"). In some cases, error correction/detection circuit 330 may provide the altered data to an external device that requested the data.

When error correction/detection circuit 330 causes aliasing of data requested from a device, an external device may be prevented from detecting errors in requested data that otherwise would have been detectable by the external device—e.g., an external device using an SECDED scheme that would have detected a double-bit error in requested data may be unable to reliably detect the triple-bit error in the requested data caused by error correction/detection circuit 330. By using error indication circuit 335 to identify and signal that error correction/detection circuit 330 detected and attempted to correct an error, external devices may determine whether the memory device detected an error, attempted to correct an error, or otherwise whether aliasing may have occurred as a result of an attempted correction by error correction/detection circuit 330, as discussed in more detail herein and with respect to FIG. 5.

Figure 4A:
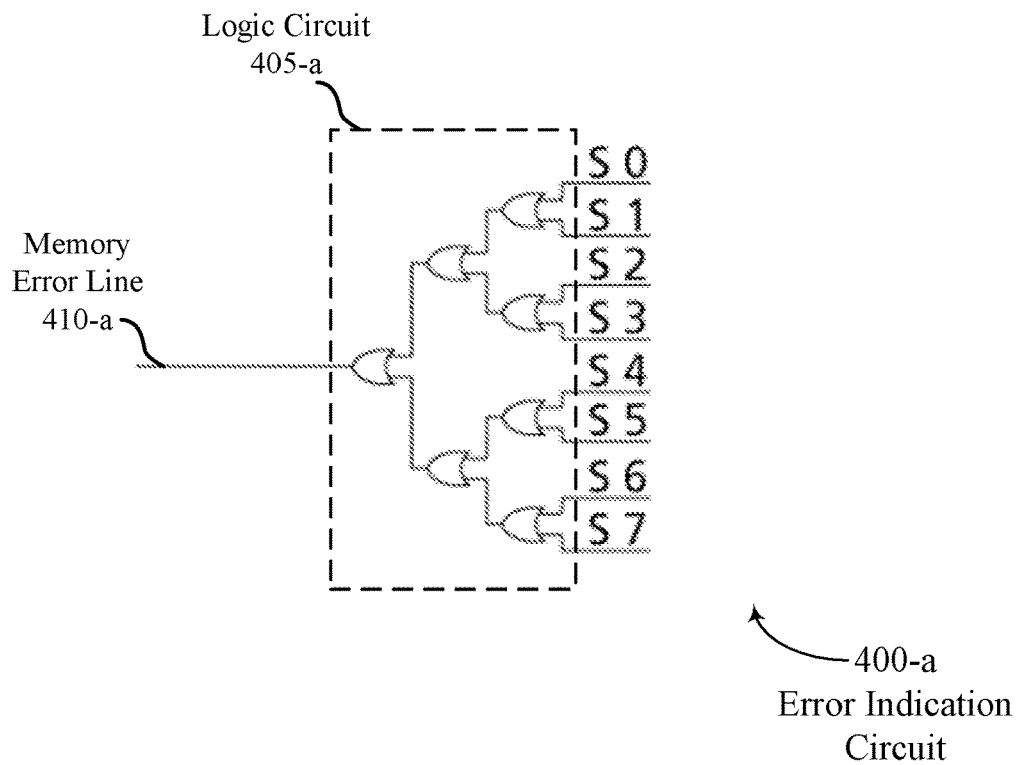
FIGS. 4A and 4B illustrate exemplary error indication circuits that support coordinated error correction as disclosed herein.

FIG. 4A illustrates an exemplary error indication circuit that supports coordinated error correction as disclosed herein.

Error indication circuit 400-a may be an example of, and similarly configured as, error indication circuit 335 of FIG. 3 to signal when an error detection circuit detects and/or corrects an error in requested data. Error indication circuit 400-a may include logic circuit 405-a and memory error line 410-a.

Logic circuit 405-a may be an example of, and similarly configured as, logic circuit 320 of FIG. 3 to determine whether a match circuit has identified a match between a stored and calculated error correction code. As shown in Table 1, logic circuit 405 may include a series of OR gates (or an "OR tree") that output a first voltage signal (e.g., a virtual ground voltage or "0") if all of inputs S0 through S7 are zeros—e.g., if there is a match between the stored and calculated error correction code. Logic circuit 405 may also output a complementary voltage signal (e.g., a supply voltage or "1") if any of inputs S0 through S7 are non-zero—e.g., if there is a mismatch between the stored and calculated error correction code.

TABLE 1

| Match Output (State) | Logic Circuit Output |
| --- | --- |
| All Zeros (Match) | Low Voltage |
| Non-Zero (Mismatch) | High Voltage |

Memory error line 410-a may be an example of, and similarly configured as, memory error line of FIG. 3 to convey an output of a logic circuit to other components—e.g., to an external device. Memory error line 410-a may be used to convey an output of logic circuit 405-a. In some cases, a voltage of memory error line 410-a is sent directly to an external device as a memory syndrome flag. That is, the external device may be immediately notified that an error correction/detection circuit detected an error when a voltage of memory error line 410-a rises or falls. In other cases, a voltage of memory error line 410-a may be written to a register in the memory device. In such cases, an external device may poll the register or may access the registers during error report modes.

Figure 4B:
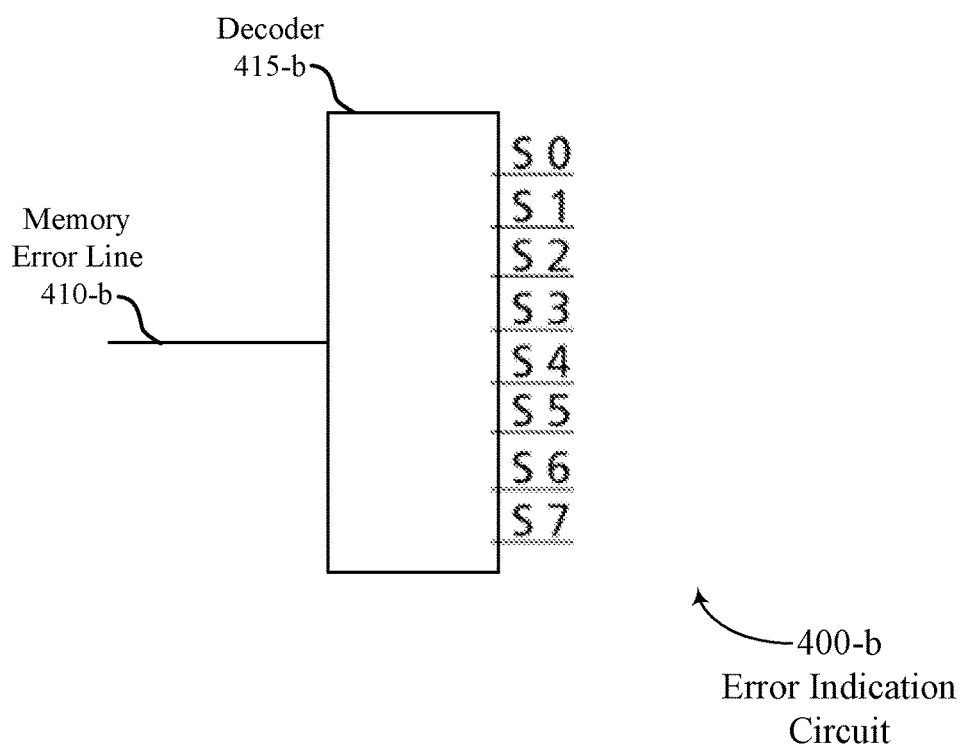

FIG. 4B illustrates an exemplary error indication circuit that supports coordinated error correction as disclosed herein.

Error indication circuit 400-b may be an example of, and similarly configured as, error indication circuit 335 of FIG. 3 to signal when an error detection circuit detects and/or corrects an error in requested data. Error indication circuit 400-b may include decoder 415-b and memory error line 410-b.

Decoder 415-b may be an example of, and similarly configured as, logic circuit 320 of FIG. 3 to determine whether a match circuit has identified a match between a stored and calculated error correction code. As shown in Table 2A, Decoder 415-b may include circuitry that generates a Boolean "false" if all of inputs S0 through S7 are zeros—e.g., if there is a match between the stored and calculated error correction code—and may generate a Boolean "true" if any one of inputs S0 through S7 are non-zero (e.g., if there is a mismatch).

TABLE 2A

| Match Output (State) | Decoder Internal Logic | Decoder Output |
| --- | --- | --- |
| All Zeros (Match) | False | Low Voltage |
| Non-Zero Value(s) (No Match) | True | High Voltage |

Alternatively, as shown in Table 2B, decoder 415-b may include circuitry that generates a Boolean "false" if (1) all of inputs S0 through S7 are zeros or (2) only one (or less than some other threshold quantity) of inputs S0 through S7 equals a non-zero value. Decoder 415-b may also generate a Boolean "true" if more than one (or at least the other threshold quantity) of inputs S0 through S7 are non-zero. By using a decoder that generates a Boolean "false" if only less than the threshold quantity of inputs S0 through S7 is non-zero, error indication circuit 400-b may ignore errors that occur in the error correction codes but not the requested data—e.g., may ignore errors that are isolated to the error correction codes.

TABLE 2B

| Match Output (State) | Decoder Internal Logic | Decoder Output |
| --- | --- | --- |
| All Zeros (Match) | False | Low Voltage |
| One Non-Zero Value (Near Match) | False | Low Voltage |
| Multiple Non-Zero Values (No Match) | True | High Voltage |

If decoder 415-b generates a Boolean "false," decoder 415-b may be configured to output a first voltage signal (e.g., a virtual ground voltage or "0"). If decoder 415-b generates a Boolean "true," decoder 415-b may be configured to output a complementary voltage signal (e.g., a supply voltage or "1").

Memory error line 410-b may be an example of, and similarly configured as, memory error line of FIG. 3 to convey an output of a logic circuit to other components—e.g., to an external device. Memory error line 410-b may be used to convey an output of decoder 415-b. In some cases, a voltage of memory error line 410-b is sent directly to an external device as a memory syndrome flag. That is, the external device may be immediately notified that an error correction/detection circuit detected an error when a voltage of memory error line 410-b rises or falls. In other cases, a voltage of memory error line 410-b may be written to a register in the memory device. In such cases, an external device poll the register or may access the registers during error report modes.

Figure 5:
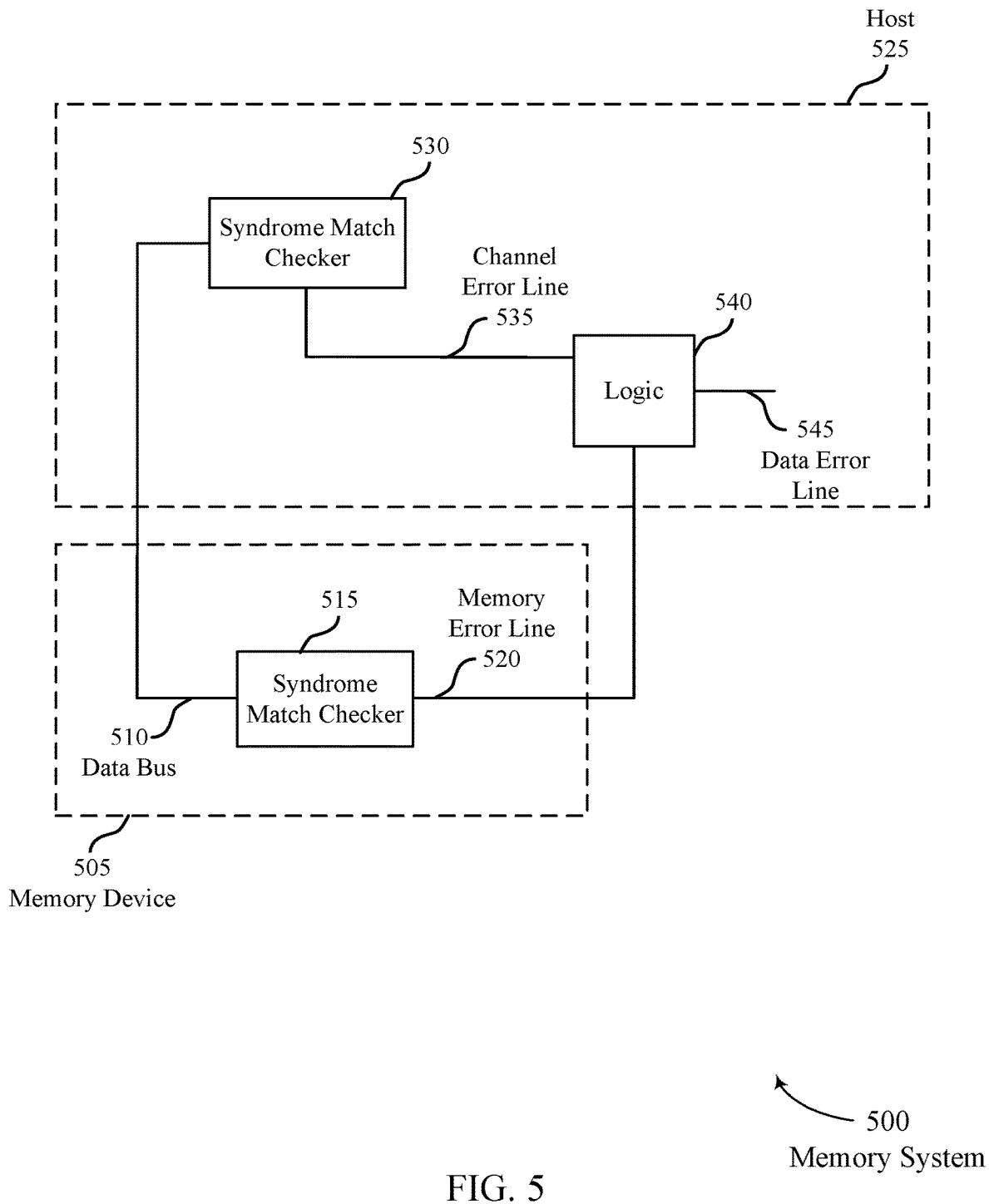
FIG. 5 illustrates an example of a memory system that supports coordinated error correction as disclosed herein.

FIG. 5 illustrates an example of a memory system that supports coordinated error correction as disclosed herein. Memory system 500 includes memory device 505 and host 525.

Memory device 505 may be configured to store data—e.g., memory device 505 may be configured to store application data for host 525. Memory device 505 may include data bus 510 (e.g., one or more DQ channels 190), memory syndrome match checker 515, and memory error line 520. Memory syndrome match checker 515 may be configured similarly, or the same, as syndrome match checker 300 of FIG. 3 to detect and/or correct errors in requested data before delivering the requested data. Memory syndrome match checker 515 may also be similarly configured to indicate that an error was detected in requested data and/or an address associated with the requested data to an external device, such as host 525.

Data bus 510 may be configured to convey data stored in memory device 505 to host syndrome match checker 530. In some cases, data bus 510 may deliver data after a request (e.g., read command) is received from host 525 for the data. In some examples, data bus 510 may deliver the requested data after the requested data is processed by memory syndrome match checker 515—e.g., after syndrome match checker detects and corrects identified errors in the requested data.

Memory error line 520 may be configured to convey an output signal generated by syndrome match checker to logic component 540. In some examples, memory error line 520 may convey a memory syndrome flag that indicates whether memory syndrome match checker 515 detected an error in data requested by host 525—e.g., by indicating a match or mismatch—and/or an address associated with the requested data. In some cases, memory error line 520 is a conductive trace. In other cases, channel error line 550 is a wireless link.

Host 525 may be configured to access data stored in memory device 505 to support the functioning of an application. Host 525 may include host syndrome match checker 530, channel error line 535, logic component 540, and data error line 545.

Host syndrome match checker 530 may be configured to detect errors in data received from memory device 505—e.g., in data received over data bus 510—and to indicate whether an error was detected in received data over channel error line 535. Host syndrome match checker 530 may also be configured to correct errors detected in received data. Host syndrome match checker 530 may be configured similarly to syndrome match checker 300 of FIG. 3. For example, host syndrome match checker 530 may support in-line ECC by host 525. In some cases, host syndrome match checker 530 may include an initial syndrome circuit that computes an initial error correction code for application data before host 525 writes the application data and the initial error correction code to the memory device 505 (e.g., as part of a single data burst, which may alternatively be referred to as a data packet, data package, or data codeword).

Host syndrome match checker 530 may also include an access syndrome circuit that computes a calculated error correction code for the application data after receiving the data from memory device 505 (e.g., by parsing a received data burst corresponding to the previously written data burst, parsing the data burst to obtain a first subset of the data burst corresponding to the previously written application data (payload) and a second subset of the data burst corresponding to parity information for the first subset that was previously calculated (generated) by host 525 (initial error correction code for the payload); a match circuit to compare the initial and calculated error correction codes to determine there is an error in the received data; and an error indication circuit to indicate whether there is an error in the received data. In some cases, an error correction/detection circuit included in host syndrome match checker 530 may be configured to detect double-bit errors and to correct single errors in received data—e.g., host syndrome match checker 530 may use SECDED techniques—and each of the stored syndrome circuit, the access syndrome circuit, and the match circuit may be configured to output an additional syndrome bit.

Channel error line 535 may be configured to convey an output signal generated by host syndrome match checker 530 to logic component 540. In some examples, channel error line 535 may convey a "channel syndrome flag" that indicates whether host syndrome match checker 530 detected an error in the received version of data requested from memory device 505. In some cases, channel error line 535 is a conductive trace.

Logic component 540 may be configured to determine whether one or both of host syndrome match checker 530 or memory syndrome match checker 515 detected in an error in a processed set of data. In some cases, logic component 540 outputs a multi-bit error flag if a memory syndrome flag and channel syndrome flag indicate that an error was detected. For example, logic component 540 may output a multi-bit error flag that indicates a multi-bit error has occurred when a memory syndrome flag indicates a mismatch and a channel syndrome flag indicates a mismatch.

Data error line 545 may be configured to convey an output signal generated by logic component 540. In some examples, data error line 545 may convey a multi-bit error flag that indicates that the requested data stored in memory device 505 contains multiple corrupted bits. In some cases, data error line 545 is a conductive trace. In other cases, data error line 545 is a wireless link.

In some cases, host 525 uses the outputs of memory syndrome match checker 515, host syndrome match checker 530, and logic component 540 to detect errors (including multi-bit errors) in received data, as shown in Table 3. Table 3 may correspond to an example where memory device 505 uses SEC techniques and host 525 uses SECDED techniques.

TABLE 3

| State of Requested Data pre DRAM ECC | Memory SEC Syndrome Flag | Host SECDED Syndrome Flag | Multi-Bit Error Flag | Host Error Detection |
|---|---|---|---|---|
| No Error | 0 | 0 | 0 | Detects No Error in Received Data |
| SBE | 1 | 0 | 0 | Detects SBE Correction |
| DBE w/out Aliasing | 1 | 1 | 1 | Detects DBE in Received Data |
| DBE w/ Aliasing | 1 | 1 | 1 | Detects MBE in Received Data—e.g., won't treat detected error as SBE |

TABLE 3-continued

| State of Requested Data pre DRAM ECC | Memory SEC Syndrome Flag | Host SECDED Syndrome Flag | Multi-Bit Error Flag | Host Error Detection |
|---|---|---|---|---|
| MBE | 1 | 1 | 1 | Detects MBE in Received Data—e.g., won't treat odds as SBE |

Host 525 may also use the outputs of memory syndrome match checker 515, host syndrome match checker 530, and logic component 540 to manage the processing of data received from memory. In some examples, after receiving an indication from memory syndrome match checker 515 that no error was detected in requested data, host 525 may forego performing an error detection procedure of the received data. For example, if memory syndrome match checker 515 uses a SEC scheme and/or link protection (e.g., CRC or link ECC) is being run for transmissions of data over the memory channel and host syndrome match checker 530 uses a SECDED scheme, host 525 may refrain from performing ECC in certain scenarios, as depicted in Table 4.

TABLE 4

| State of Requested Data pre DRAM ECC | Memory SEC Syndrome Flag | Host SECDED Syndrome Flag | Multi-Bit Error Flag | Host ECC Calculation Decision (Detection) |
|---|---|---|---|---|
| No Error | 0 | 0 | 0 | Doesn't Calculate ECC (No Error) |
| SBE | 1 | 0 | 0 | Calculates ECC (Corrected SBE Detected) |
| DBE w/out Aliasing | 1 | 1 | 1 | Calculates ECC (DBE Detected) |
| DBE w/ Aliasing | 1 | 1 | 1 | Calculates ECC (MBE Detected) |
| MBE | 1 | 1 | 1 | Calculates ECC (MBE Detected) |

In some cases, host 525 further refrains from performing an ECC calculation if the memory syndrome flag indicates that an error of a certain type (e.g., an SBE) was corrected.

In another example, if memory syndrome match checker 515 uses a SECDED scheme and/or link protection (e.g., CRC or link ECC) is being run for transmissions of data over the memory channel and host syndrome match checker 530 uses a SECDED scheme, host 525 may refrain from performing ECC in certain scenarios, as depicted in Table 5.

TABLE 5

| State of Requested Data pre DRAM ECC | Memory SECDED Syndrome Flag | Host SECDED Syndrome Flag | Multi-Bit Error Flag | Host ECC Calculation Decision (Detection) |
|---|---|---|---|---|
| No Error | 0 | 0 | 0 | Doesn't Calculate ECC (No Error) |
| SBE | 1 | 0 | 0 | Calculates ECC (Corrected SBE Detected) |
| DBE | 1 | 1 | 1 | Calculates ECC (DBE Detected) |
| MBE | 1 | 1 | 1 | Calculates ECC (MBE Detected) |

In some cases, host 525 further refrains from performing an ECC calculation if the memory syndrome flag indicates that an error of a certain type (e.g., an SBE) was corrected.

Host 525 may also use the outputs of memory syndrome match checker 515, host syndrome match checker 530, and logic component 540 to manage the storage of data in memory. In some examples, after identifying that data stored in memory device 505 contains multiple-bit errors, host 525 may blacklist the memory address associated with the data. That is, host 525 may indicate to memory device 505 that no application data for host 525 is to be stored at the blacklisted memory address in a memory array of memory device 505.

Additionally or alternatively, host 525 or memory device 505 may use the information to perform "smart scrubbing" of the memory array in memory device 505—an error correction technique that involves periodically reading the contents of a memory array, performing an error correction on the contents of the memory array, and rewriting data that is identified as being corrupted with the correct version of the data may be referred to as "scrubbing." That is, host 525 may trigger memory device 505 to—or memory device 505 on its own—may scrub (e.g., only) data located at the memory addresses that have been identified by and/or indicated by memory device 505 as being corrupted. The scrubbing procedure may skip (ignore) pages or other sets of memory cells not associated with an identified error during a relevant time period (e.g., over the entire operation history of the device, or since a last scrubbing procedure).

In some examples, host 525 may not include host syndrome match checker 530—e.g., host 525 may not generate a host syndrome flag. In such cases, host 525 may use the output of memory syndrome match checker 515 to detect, or aid in the detection of, errors in received data.

For example, if memory syndrome match checker 515 uses a SEC scheme and/or link protection (e.g., CRC or link ECC) is being run for transmissions of data over the memory channel and host 525 does not include host syndrome match checker 530, host 525 may refrain from performing ECC in certain scenarios, as depicted in Table 6.

TABLE 6

| State of Requested Data pre DRAM ECC | Memory SEC Syndrome Flag | Host SECDED Syndrome Flag | Multi-Bit Error Flag | Host ECC Calculation Decision (Detection) |
|---|---|---|---|---|
| No Error | 0 | N/A | N/A | Doesn't Calculate ECC (No Error) |
| SBE | 1 | N/A | N/A | Calculates ECC (No Error Detected) |
| DBE w/out Aliasing | 1 | N/A | N/A | Calculates ECC (DBE Detected) |
| DBE w/ Aliasing | 1 | N/A | N/A | Calculates ECC (Detects SBE) |
| MBE | 1 | N/A | N/A | Calculates ECC (Treats Odds as SBE) |

In another example, if memory syndrome match checker 515 uses a SECDED scheme and/or link protection (e.g., CRC or link ECC) is being run for transmissions of data over the memory channel and host 525 does not include host syndrome match checker 530, host 525 may refrain from performing ECC in certain scenarios, as depicted in Table 7.

TABLE 7

| State of Requested Data pre DRAM ECC | Memory SECDED Syndrome Flag | Host SECDED Syndrome Flag | Multi-Bit Error Flag | Host ECC Calculation Decision (Detection) |
|---|---|---|---|---|
| No Error | 0 | N/A | N/A | Doesn't Calculate ECC (No Error) |
| SBE | 1 | N/A | N/A | Calculates ECC (No Error Detected) |
| DBE | 1 | N/A | N/A | Calculates ECC (DBE Detected) |
| MBE | 1 | N/A | N/A | Calculates ECC (Treats Odds as SBE) |

Figure 6:
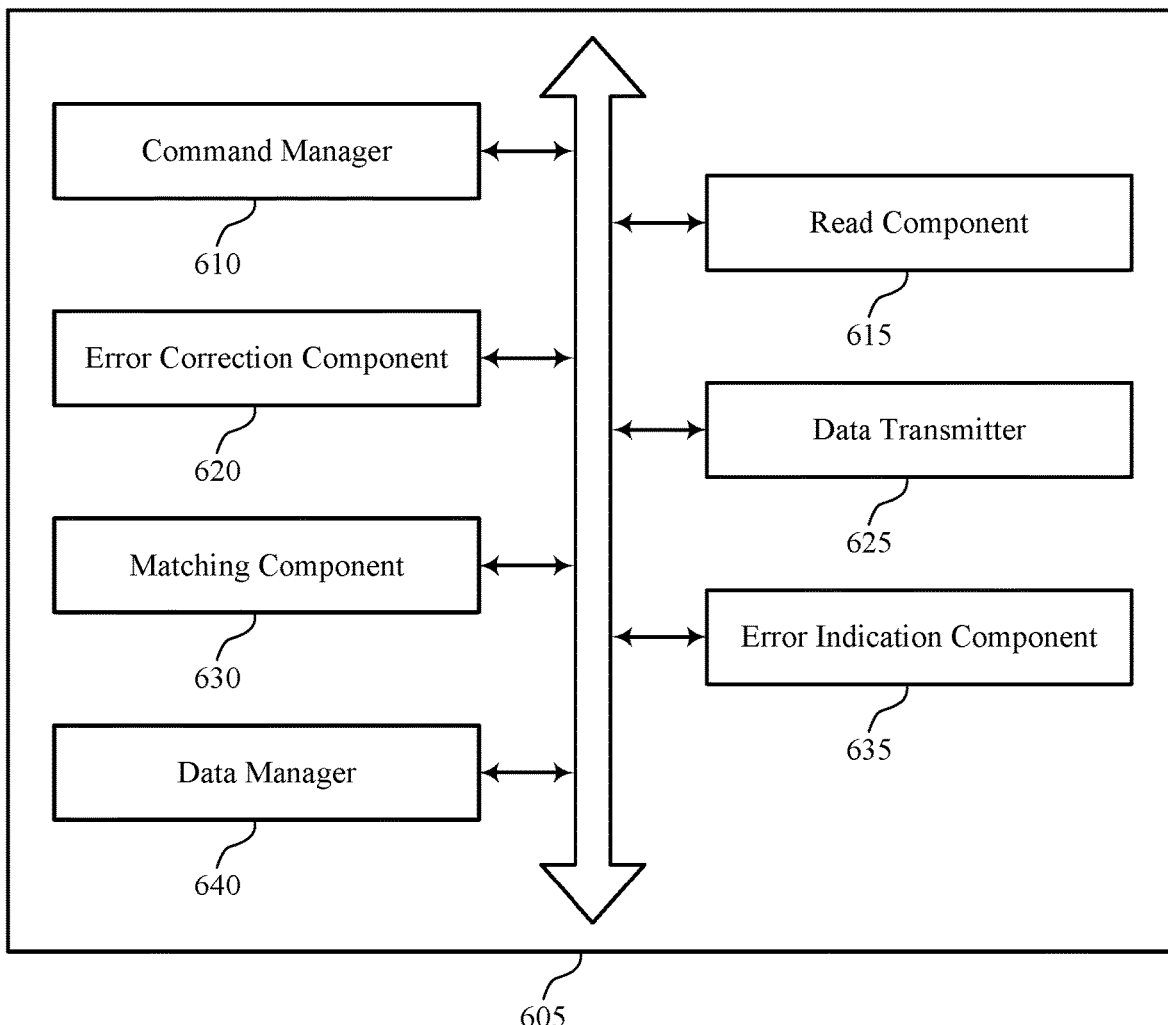
FIG. 6 shows a block diagram of a memory array that supports coordinated error correction in accordance with aspects of the present disclosure.

FIG. 6 shows a block diagram 600 of a memory array 605 that supports coordinated error correction in accordance with examples as disclosed herein. The memory array 605 may be an example of aspects of a memory array as described with reference to FIGS. 1 through 5. The memory array 605 may include a command manager 610, a read component 615, an error correction component 620, a data transmitter 625, a matching component 630, an error indication component 635, and a data manager 640. Each of these modules may communicate, directly or indirectly, with one another (e.g., via one or more buses).

The command manager 610 may receive, at a memory device including a memory array, a read command from a host device. In some examples, the command manager 610 may receive, at a memory device including a memory array, a read command from a host device. In some examples, the command manager 610 may receive, at the memory device, a second read command from the host device.

The read component 615 may read a set of data from the memory array based on the read command.

The error correction component 620 may alter, based on performing an error correction procedure for the set of data, a value of a bit in the set of data to obtain an altered set of data. In some examples, the error correction component 620 may read a set of data from the memory array based on the read command. In some examples, the error correction component 620 may identify an error included in the set of data read from the memory array. In some examples, the error correction component 620 may attempt to correct the error based at least in part generating an altered set of data. In some examples, the error correction component 620 may read, at the memory device, a first error correction code from the memory array based on the read command. In some examples, the error correction component 620 may generate, at the memory device, a second error correction code based on the set of data read from the memory array. In some examples, the error correction component 620 may store, based on the altering, an indication of an address associated with the set of data.

In some examples, the error correction component 620 may read a second set of data from the memory array based on the second read command. In some examples, the error correction component 620 may perform an error correction procedure for the second set of data. In some examples, the error correction component 620 may determine, based on the error correction procedure for the second set of data, that the second set of data is free of errors.

The data transmitter 625 may transmit, to the host device, the altered set of data and an indication of the altering. In some examples, the data transmitter 625 may transmit, to the host device, the altered set of data and an indication of the attempt to correct the error. In some examples, the data transmitter 625 may transmit, to the host device, the second set of data and an indication that the second set of data is unaltered. In some examples, the data transmitter 625 may receive a request from the host device for the indication of the altering, the transmitting in response to the request.

The matching component 630 may determine that a set of one or more bits of the second error correction code differ from a corresponding set of one or more bits of the first error correction code, the altering based on a quantity of bits included in the set of one or more bits satisfying a threshold. In some cases, the threshold is one bit. In other cases, the threshold is two bits. In some examples, the matching component 630 may perform a set of exclusive or (XOR) operations, where each XOR operation of the set based on a bit of the second error correction code and a corresponding bit of the first error correction code, where the determining is based on the set of XOR operations. In some examples, the matching component 630 may generate the indication of the altering based on results of the set of XOR operations.

The error indication component 635 may generate, for a set of bits included in the second error correction code, respective indications of whether a bit of the second error correction code matches a corresponding bit of the first error correction code, where the determining is based on the respective indications. In some examples, the error indication component 635 may store the indication of the altering at the memory device. In some cases, the indication of the altering includes an indication that the memory device attempted to correct an error associated with the set of data. In some cases, the indication of the altering is transmitted concurrently with at least a portion of the altered set of data.

The data manager 640 may perform a scrubbing procedure to correct erroneous data stored in the memory array, where performing the scrubbing procedure includes scrubbing only a subset of the memory array that includes memory cells associated with the address.

Figure 7:
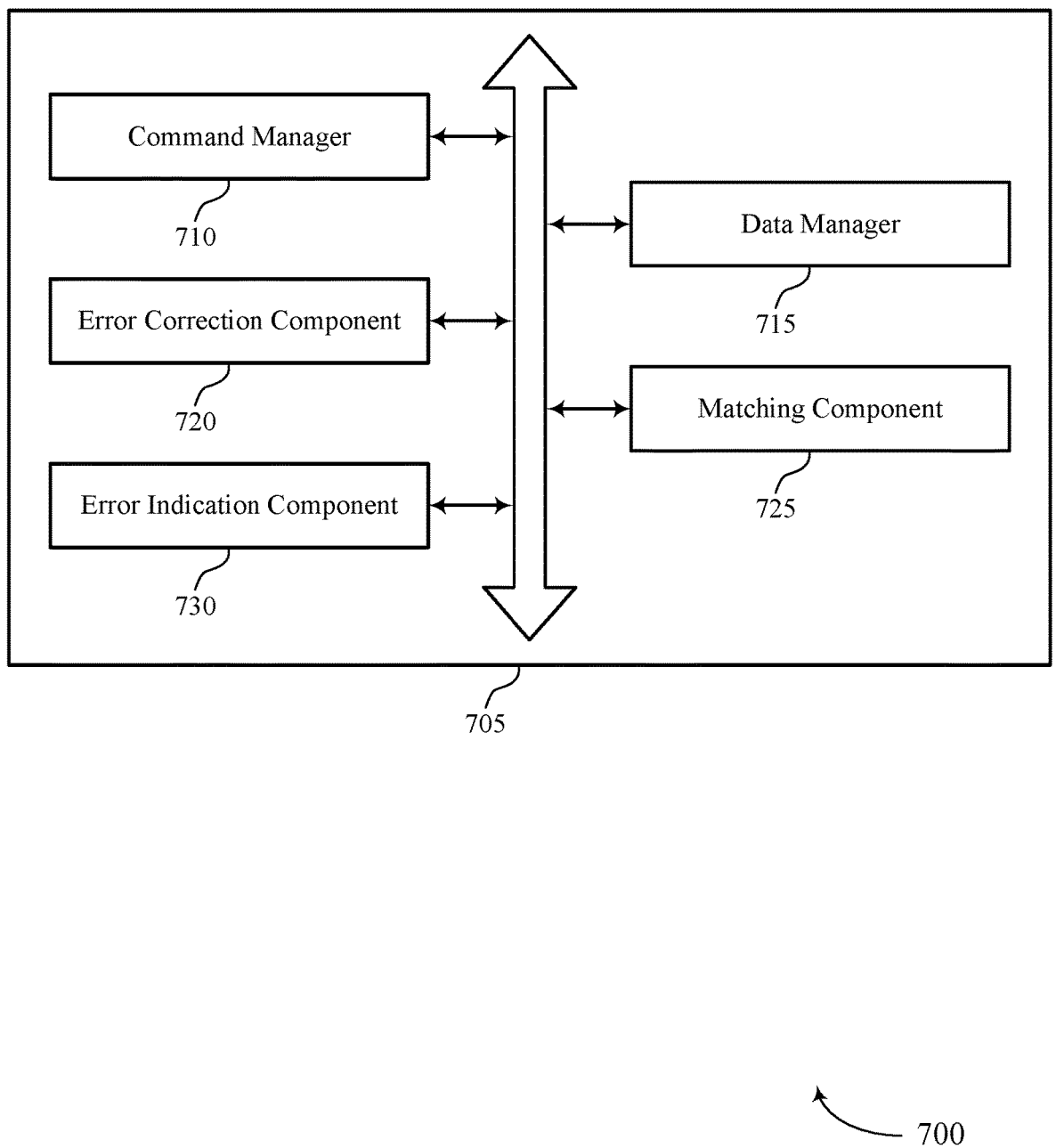
FIG. 7 shows a block diagram of a host device that supports coordinated error correction in accordance with aspects of the present disclosure.

FIG. 7 shows a block diagram 700 of a host device 705 that supports coordinated error correction in accordance with examples as disclosed herein. The host device 705 may be an example of aspects of a host device as described with reference to FIGS. 1 through 6. The host device 705 may include a command manager 710, a data manager 715, an error correction component 720, a matching component 725, and an error indication component 730. Each of these modules may communicate, directly or indirectly, with one another (e.g., via one or more buses).

The command manager 710 may transmit a read command to a memory device. In some examples, the command manager 710 may transmit a second read command to the memory device. In some examples, the command manager 710 may transmit a third read command to the memory device.)

The data manager 715 may receive, from the memory device, a set of data associated with the read command and an indication that the memory device attempted to correct a first error associated with the set of data. In some examples, the data manager 715 may discard the set of data received from the memory device based on the second error and the indication.

In some examples, the data manager 715 may receive, from the memory device, a second set of data associated with the second read command and an indication that the memory device attempted to correct a first error associated with the second set of data. In some examples, the data manager 715 may execute an operation based on the second payload.

In some examples, the data manager 715 may receive, from the memory device, a third set of data associated with the third read command and an indication that the third set of data is error-free.

The error correction component 720 may perform an error correction procedure for a payload included in the set of data. In some examples, the error correction component 720 may determine, based on the error correction procedure for the payload, a second error associated with the payload.

In some examples, the error correction component 720 may perform an error correction procedure for a second payload included in the second set of data. In some examples, the error correction component 720 may determine, based on the error correction procedure for the second payload, that the second payload is error-free.

In some examples, the error correction component 720 may skip an error correction procedure for a third payload included in the third set of data based on the indication that the second set of data is error-free.

In some examples, the error correction component 720 may perform the error correction procedure for the payload is in response to the indication that the memory device attempted to correct the first error associated with the set of data. In some examples, the error correction component 720 may obtain, from the set of data, a first error correction code. In some examples, the error correction component 720 may generate, based on the set of data, a second error correction code. In some examples, the error correction component 720 may identify an address associated with the set of data. In some examples, the error correction component 720 may store the address to a list of defective addresses associated with the memory device.

The matching component 725 may determine a mismatch between a bit of the second error correction code and a corresponding bit of the first error correction code, where determining that the second error is associated with the payload is based on the mismatch.

The error indication component 730 may transmit, to the memory device, an indication of the second error.

Figure 8:
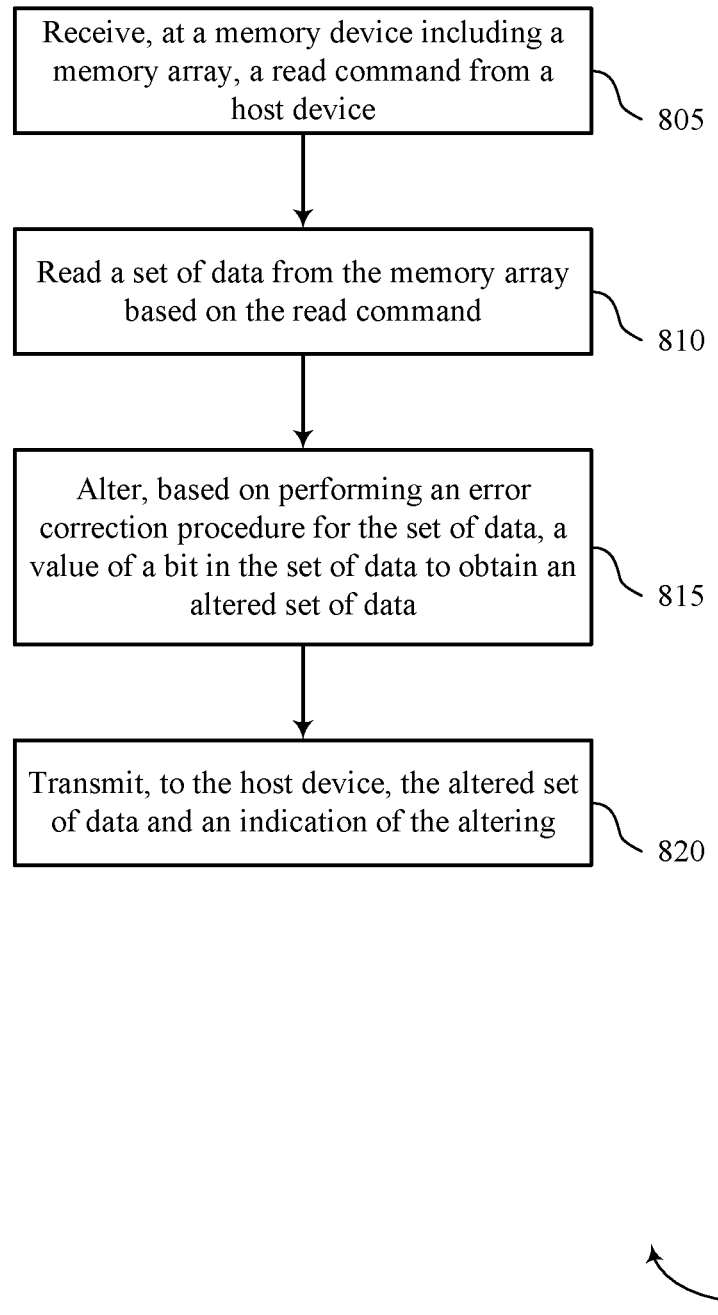
FIGS. 8 through 10 show flowcharts illustrating a method or methods that support coordinated error correction in accordance with examples as disclosed herein.

FIG. 8 shows a flowchart illustrating a method or methods 800 that supports coordinated error correction in accordance with aspects of the present disclosure. The operations of method 800 may be implemented by a memory array or its components as described herein. For example, the operations of method 800 may be performed by a memory array as described with reference to FIG. 6. In some examples, a memory array may execute a set of instructions to control the functional elements of the memory array to perform the described functions. Additionally, or alternatively, a memory array may perform aspects of the described functions using special-purpose hardware.

At 805, the memory array may receive, at a memory device including a memory array, a read command from a host device. The operations of 805 may be performed according to the methods described herein. In some examples, aspects of the operations of 805 may be performed by a command manager as described with reference to FIG. 6.

At 810, the memory array may read a set of data from the memory array based on the read command. The operations of 810 may be performed according to the methods described herein. In some examples, aspects of the operations of 810 may be performed by a read component as described with reference to FIG. 6.

At 815, the memory array may alter, based on performing an error correction procedure for the set of data, a value of a bit in the set of data to obtain an altered set of data. The operations of 815 may be performed according to the methods described herein. In some examples, aspects of the operations of 815 may be performed by an error correction component as described with reference to FIG. 6.

At 820, the memory array may transmit, to the host device, the altered set of data and an indication of the altering. The operations of 820 may be performed according to the methods described herein. In some examples, aspects of the operations of 820 may be performed by a data transmitter as described with reference to FIG. 6.

In some examples, an apparatus as described herein may perform a method or methods, such as the method 800. The apparatus may include features, means, or instructions (e.g., a non-transitory computer-readable medium storing instructions executable by a processor) for receiving, at a memory device including a memory array, a read command from a host device, reading a set of data from the memory array based on the read command, altering, based on performing an error correction procedure for the set of data, a value of a bit in the set of data to obtain an altered set of data, and transmitting, to the host device, the altered set of data and an indication of the altering.

In some examples of the method 800 and the apparatus described herein, performing the error correction procedure for the set of data may include operations, features, means, or instructions for reading, at the memory device, a first error correction code from the memory array based on the read command, generating, at the memory device, a second error correction code based on the set of data read from the memory array, and determining that a set of one or more bits of the second error correction code differ from a corresponding set of one or more bits of the first error correction code, the altering based on a quantity of bits included in the set of one or more bits satisfying a threshold.

In some examples of the method 800 and the apparatus described herein, the threshold may be one bit. In other examples of the method 800 and the apparatus described herein, the threshold may be two bits.

Some examples of the method 800 and the apparatus described herein may further include operations, features, means, or instructions for performing a set of exclusive or (XOR) operations, where each XOR operation of the set based on a bit of the second error correction code and a corresponding bit of the first error correction code, where the determining may be based on the set of XOR operations.

Some examples of the method 800 and the apparatus described herein may further include operations, features, means, or instructions for generating the indication of the altering based on results of the set of XOR operations.

Some examples of the method 800 and the apparatus described herein may further include operations, features, means, or instructions for generating, for a set of bits included in the second error correction code, respective indications of whether a bit of the second error correction code matches a corresponding bit of the first error correction code, where the determining may be based on the respective indications.

Some examples of the method 800 and the apparatus described herein may further include operations, features, means, or instructions for receiving, at the memory device, a second read command from the host device, reading a second set of data from the memory array based on the second read command, performing an error correction procedure for the second set of data, determining, based on the error correction procedure for the second set of data, that the second set of data may be free of errors, and transmitting, to the host device, the second set of data and an indication that the second set of data may be unaltered.

Some examples of the method 800 and the apparatus described herein may further include operations, features, means, or instructions for storing the indication of the altering at the memory device, and receiving a request from the host device for the indication of the altering, the transmitting in response to the request.

In some examples of the method 800 and the apparatus described herein, the indication of the altering includes an indication that the memory device attempted to correct an error associated with the set of data.

In some examples of the method 800 and the apparatus described herein, the indication of the altering may be transmitted concurrently with at least a portion of the altered set of data.

Some examples of the method 800 and the apparatus described herein may further include operations, features, means, or instructions for storing, based on the altering, an indication of an address associated with the set of data, and performing a scrubbing procedure to correct erroneous data stored in the memory array, where performing the scrubbing procedure includes scrubbing only a subset of the memory array that includes memory cells associated with the address.

Figure 9:
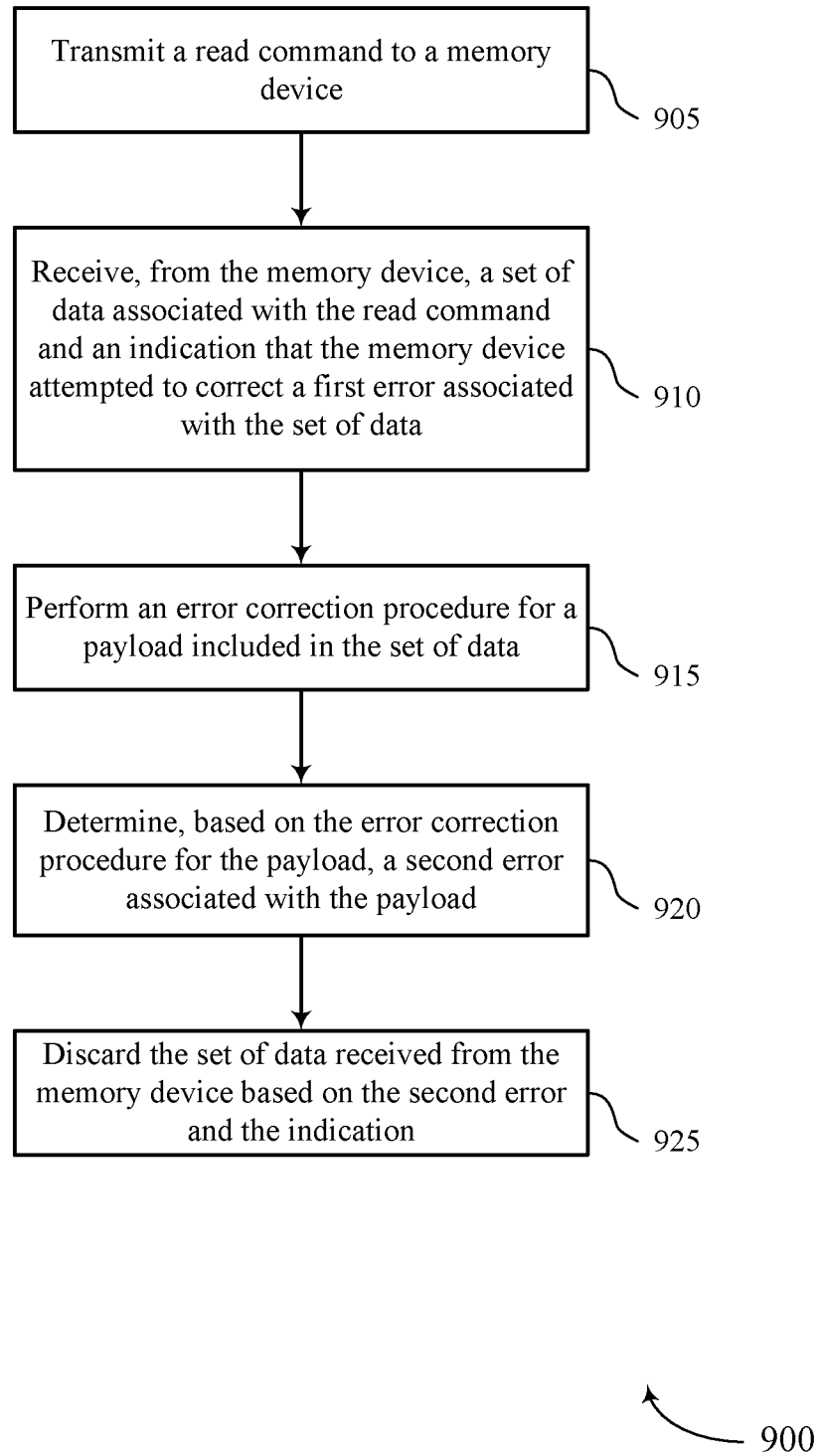

FIG. 9 shows a flowchart illustrating a method or methods 900 that supports coordinated error correction in accordance with aspects of the present disclosure. The operations of method 900 may be implemented by a host device or its components as described herein. For example, the operations of method 900 may be performed by a host device as described with reference to FIG. 7. In some examples, a host device may execute a set of instructions to control the functional elements of the host device to perform the described functions. Additionally, or alternatively, a host device may perform aspects of the described functions using special-purpose hardware.

At 905, the host device may transmit a read command to a memory device. The operations of 905 may be performed according to the methods described herein. In some examples, aspects of the operations of 905 may be performed by a command manager as described with reference to FIG. 7.

At 910, the host device may receive, from the memory device, a set of data associated with the read command and an indication that the memory device attempted to correct a first error associated with the set of data. The operations of 910 may be performed according to the methods described herein. In some examples, aspects of the operations of 910 may be performed by a data manager as described with reference to FIG. 7.

At 915, the host device may perform an error correction procedure for a payload included in the set of data. The operations of 915 may be performed according to the methods described herein. In some examples, aspects of the operations of 915 may be performed by an error correction component as described with reference to FIG. 7.

At 920, the host device may determine, based on the error correction procedure for the payload, a second error associated with the payload. The operations of 920 may be performed according to the methods described herein. In some examples, aspects of the operations of 920 may be performed by an error correction component as described with reference to FIG. 7.

At 925, the host device may discard the set of data received from the memory device based on the second error and the indication. The operations of 925 may be performed according to the methods described herein. In some examples, aspects of the operations of 925 may be performed by a data manager as described with reference to FIG. 7.

In some examples, an apparatus as described herein may perform a method or methods, such as the method 900. The apparatus may include features, means, or instructions (e.g., a non-transitory computer-readable medium storing instructions executable by a processor) for transmitting a read command to a memory device, receiving, from the memory device, a set of data associated with the read command and an indication that the memory device attempted to correct a first error associated with the set of data, performing an error correction procedure for a payload included in the set of data, determining, based on the error correction procedure for the payload, a second error associated with the payload, and discarding the set of data received from the memory device based on the second error and the indication.

Some examples of the method 900 and the apparatus described herein may further include operations, features, means, or instructions for transmitting a second read command to the memory device, receiving, from the memory device, a second set of data associated with the second read command and an indication that the memory device attempted to correct a first error associated with the second set of data, performing an error correction procedure for a second payload included in the second set of data, determining, based on the error correction procedure for the second payload, that the second payload may be error-free, and executing an operation based on the second payload.

Some examples of the method 900 and the apparatus described herein may further include operations, features, means, or instructions for transmitting a third read command to the memory device, receiving, from the memory device, a third set of data associated with the third read command and an indication that the third set of data may be error-free, and skipping an error correction procedure for a third payload included in the third set of data based on the indication that the second set of data may be error-free.

Some examples of the method 900 and the apparatus described herein may further include operations, features, means, or instructions for performing the error correction procedure for the payload may be in response to the indication that the memory device attempted to correct the first error associated with the set of data.

In some examples of the method 900 and the apparatus described herein, performing the error correction procedure for the payload may include operations, features, means, or instructions for obtaining, from the set of data, a first error correction code, generating, based on the set of data, a second error correction code, and determining a mismatch between a bit of the second error correction code and a corresponding bit of the first error correction code, where determining that the second error may be associated with the payload may be based on the mismatch.

Some examples of the method 900 and the apparatus described herein may further include operations, features, means, or instructions for identifying an address associated with the set of data, and storing the address to a list of defective addresses associated with the memory device.

Some examples of the method 900 and the apparatus described herein may further include operations, features, means, or instructions for transmitting, to the memory device, an indication of the second error.

Figure 10:
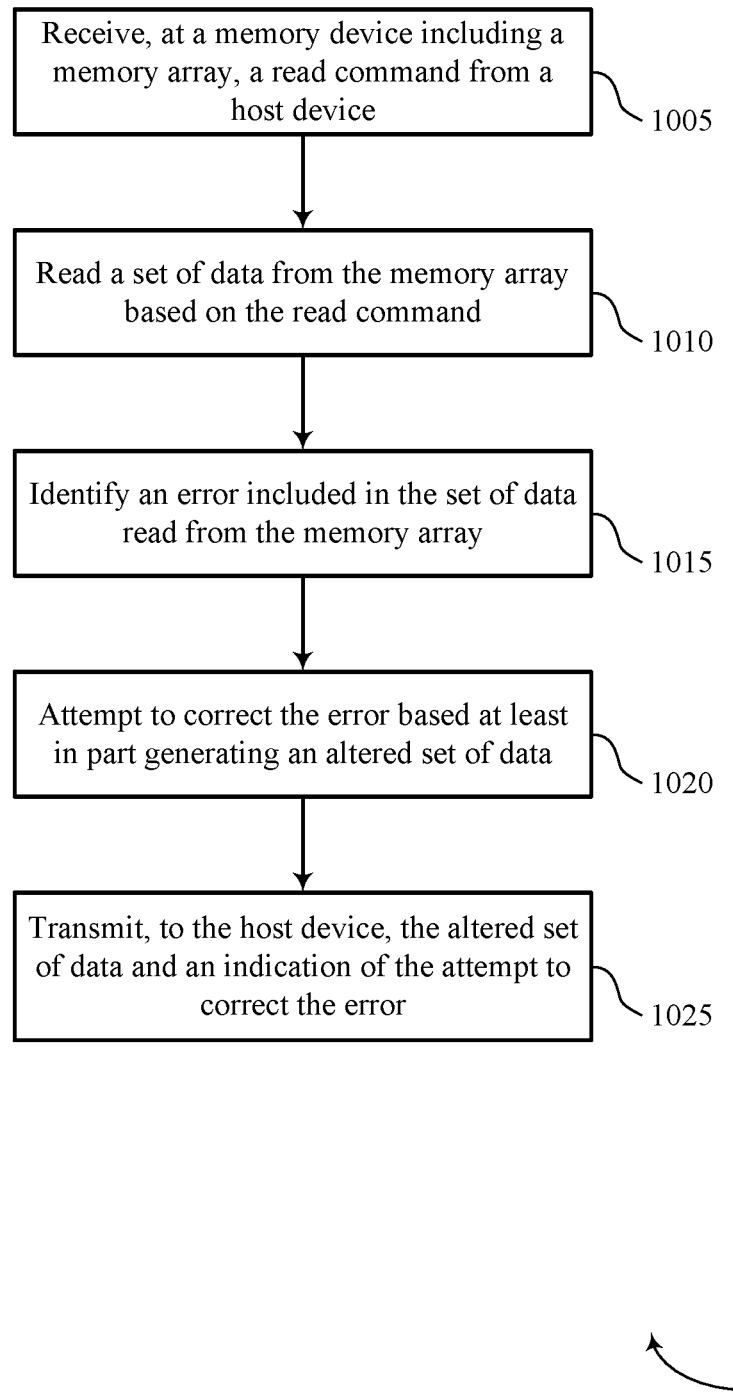

FIG. 10 shows a flowchart illustrating a method or methods 1000 that supports coordinated error correction in accordance with aspects of the present disclosure. The operations of method 1000 may be implemented by a memory array or its components as described herein. For example, the operations of method 1000 may be performed by a memory array as described with reference to FIG. 6. In some examples, a memory array may execute a set of instructions to control the functional elements of the memory array to perform the described functions. Additionally, or alternatively, a memory array may perform aspects of the described functions using special-purpose hardware.

At 1005, the memory array may receive, at a memory device including a memory array, a read command from a host device. The operations of 1005 may be performed according to the methods described herein. In some examples, aspects of the operations of 1005 may be performed by a command manager as described with reference to FIG. 6.

At 1010, the memory array may read a set of data from the memory array based on the read command. The operations of 1010 may be performed according to the methods described herein. In some examples, aspects of the operations of 1010 may be performed by an error correction component as described with reference to FIG. 6.

At 1015, the memory array may identify an error included in the set of data read from the memory array. The operations of 1015 may be performed according to the methods described herein. In some examples, aspects of the operations of 1015 may be performed by an error correction component as described with reference to FIG. 6.

At 1020, the memory array may attempt to correct the error based at least in part generating an altered set of data. The operations of 1020 may be performed according to the methods described herein. In some examples, aspects of the operations of 1020 may be performed by an error correction component as described with reference to FIG. 6.

At 1025, the memory array may transmit, to the host device, the altered set of data and an indication of the attempt to correct the error. The operations of 1025 may be performed according to the methods described herein. In some examples, aspects of the operations of 1025 may be performed by a data transmitter as described with reference to FIG. 6.

In some examples, an apparatus as described herein may perform a method or methods, such as the method 1000. The apparatus may include features, means, or instructions (e.g., a non-transitory computer-readable medium storing instructions executable by a processor) for receiving, at a memory device including a memory array, a read command from a host device, reading a set of data from the memory array based on the read command, identifying an error included in the set of data read from the memory array, attempting to correct the error based at least in part generating an altered set of data, and transmitting, to the host device, the altered set of data and an indication of the attempt to correct the error.

It should be noted that the methods described herein are possible implementations, and that the operations and the steps may be rearranged or otherwise modified and that other implementations are possible. Furthermore, portions from two or more of the methods may be combined.

An apparatus is described. The apparatus may include a memory array, error correction logic coupled with the memory array and operable to, an indication component coupled with the error correction logic and operable to generate an indication of the attempt to correct the error, and an output component operable to output the indication to a host device for the apparatus.

In some examples, the error correction logic may be operable to identify the error based on a bitwise comparison of each bit included in the first error correction code to a corresponding bit included in the second error correction code.

In some examples, the bitwise comparison may be based on a set of exclusive or (XOR) operations, each XOR operation of the set corresponding to a first respective bit included in the first error correction code and a second respective bit included in the second error correction code.

In some examples, the error correction logic may be operable to generate, based on a comparison of the first error correction code to the second error correction code, a set of indications each indicative of whether a mismatch exists between a first respective bit included in the first error correction code and a second respective bit included in the second error correction code, and the indication component may be operable to generate the indication of the attempt to correct the error in response to the set of indications indicating at least a threshold quantity of one or more mismatches.

Some examples of the apparatus may include error correction logic may be operable to attempt to correct the error based on the set of indications indicating at least the threshold quantity of one or more mismatches.

In some examples, the threshold quantity of one or more mismatches may be one mismatch. In other examples, the threshold quantity of one or more mismatches may be two mismatches.

In some examples, a scrubbing component coupled with the error correction logic and operable to correct erroneous data stored in the memory array, where the scrubbing component may be operable to ignore a first portion of the memory array based on the error being identified as corresponding to a second portion of the memory array.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

As used herein, the term "virtual ground" refers to a node of an electrical circuit that is held at a voltage of approximately zero volts (0V) but that is not directly coupled with ground. Accordingly, the voltage of a virtual ground may temporarily fluctuate and return to approximately 0V at steady state. A virtual ground may be implemented using various electronic circuit elements, such as a voltage divider consisting of operational amplifiers and resistors. Other implementations are also possible. "Virtual grounding" or "virtually grounded" means connected to approximately 0V.

The terms "electronic communication," "conductive contact," "connected," "coupled," and "couplable" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some cases, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow. The term "couplable" refers to a component that is configured for coupling with another component to provide the closed-circuit relationship capable of communicating signals between the components over conductive paths.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The devices discussed herein, including a memory array, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (e.g., majority carriers are signals), then the FET may be referred to as a n-type FET. If the channel is p-type (e.g., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (e.g., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. A method, comprising:
   receiving, at a memory device, a read command from a host device;
   reading, in response to the read command from a memory array of the memory device, a set of data and a first error correction code associated with the set of data;
   generating, at the memory device based at least in part on reading the set of data and the first error correction code, a second error correction code for the set of data;
   comparing, based at least in part on generating the second error correction code, the first error correction code and the second error correction code; and
   transmitting, to the host device, the set of data and an indication of whether the first error correction code and the second error correction code match based at least in part on the comparing, wherein the indication also indicates whether an attempt to correct an error in the set of data was performed.

2. The method of claim 1, further comprising:
   identifying a match between the first error correction code and the second error correction code based at least in part on the comparing, wherein the indication indicates that the first error correction code and the second error correction code match based at least in part on the identifying.

3. The method of claim 2, wherein the indication further indicates that the set of data is error-free based at least in part on the identifying.

4. The method of claim 1, further comprising:
   identifying a mismatch between the first error correction code and the second error correction code based at least in part on the comparing, wherein the indication indicates that the first error correction code and the second error correction code mismatch based at least in part on the identifying.

5. The method of claim 4, wherein the indication further indicates an attempt to correct an error in the set of data based at least in part on the identifying.

6. The method of claim 4, further comprising:
   attempting to correct an error in the set of data based at least in part on identifying the mismatch, wherein the set of data is transmitted to the host device after attempting to correct the error in the set of data.

7. The method of claim 6, wherein:
   comparing the first error correction code and the second error correction code comprises inputting the first error correction code and the second error correction code into an exclusive or gate, and
   attempting to correct the error comprises:
     determining a location of the error in the set of data based at least in part on an output of the exclusive or gate, and
     flipping a bit of the set of data at the location determined based at least in part on the output of the exclusive or gate.

8. A method, comprising:
   transmitting, from a host device, a read command;
   receiving, in response to the read command, a set of data, a first error correction code, and a first indication indicating whether an error correction attempt was performed for the set of data;
   generating, at the host device, a second error correction code for the set of data based at least in part on receiving the set of data;
   comparing, based at least in part on generating the second error correction code, the first error correction code and the second error correction code;
   generating, based at least in part on the comparing, a second indication of whether the first error correction code and the second error correction code are matching; and
   determining, by the host device, whether to use or discard the set of data based at least in part on the second indication.

9. The method of claim 8, further comprising:
   identifying a match between the first error correction code and the second error correction code based at least in part on the comparing, wherein the second indication indicates that the first error correction code and the second error correction code match based at least in part on the identifying.

10. The method of claim 9, wherein:
the second indication further indicates that the set of data is error-free based at least in part on the identifying, and
the host device determines to use the set of data based at least in part on the second indication indicating that the set of data is error-free.

11. The method of claim 8, further comprising:
identifying a mismatch between the first error correction code and the second error correction code based at least in part on the comparing, wherein the second indication indicates that the first error correction code and the second error correction code mismatch based at least in part on the identifying.

12. The method of claim 11, wherein the host device determines to discard the set of data based at least in part on the second indication indicating that the set of data contains an error.

13. The method of claim 11,
wherein the host device determines to discard the set of data based at least in part on the second indication indicating that the set of data contains an error and the first indication indicating that the error correction attempt was performed for the set of data.

14. The method of claim 8, wherein comparing the first error correction code and the second error correction code comprises:
inputting the first error correction code and the second error correction code into an exclusive or gate, wherein a non-zero output of the exclusive or gate indicates a mismatch between the first error correction code and the second error correction code.

15. The method of claim 8, further comprising:
adding, to a deny list, an address associated with the read command and the set of data based at least in part on the second indication indicating a mismatch between the first error correction code and the second error correction code and the first indication indicating that the error correction attempt was performed; and
refraining from storing data at the address based at least in part on adding the address to the deny list.

16. The method of claim 8, further comprising:
determining to skip an error correction procedure for the set of data based at least in part on the first indication indicating that no error correction attempt was performed for the set of data, the second indication indicating a match between the first error correction code and the second error correction code, or both.

17. An apparatus, comprising:
memory; and
a processor coupled with the memory and configured to cause the apparatus to:
transmit, from a host device, a read command;
receive, in response to the read command, a set of data, a first error correction code, and a first indication indicating whether an error correction attempt was performed for the set of data;
generate, at the host device, a second error correction code for the set of data based at least in part on receiving the set of data;
compare, based at least in part on generating the second error correction code, the first error correction code and the second error correction code;
generate, based at least in part on the comparing, a second indication of whether the first error correction code and the second error correction code are matching; and
determine, by the host device, whether to use or discard the set of data based at least in part on the second indication.

18. The apparatus of claim 17, wherein the processor is further configured to cause the apparatus to:
identify a match between the first error correction code and the second error correction code based at least in part on the comparing, wherein the second indication indicates that the first error correction code and the second error correction code match based at least in part on the identifying.

19. The apparatus of claim 17, wherein the processor is further configured to cause the apparatus to:
identify a mismatch between the first error correction code and the second error correction code based at least in part on the comparing, wherein the second indication indicates that the first error correction code and the second error correction code mismatch based at least in part on the identifying.

20. The apparatus of claim 17, wherein comparing the first error correction code and the second error correction code comprises:
inputting the first error correction code and the second error correction code into an exclusive or gate, wherein a non-zero output of the exclusive or gate indicates a mismatch between the first error correction code and the second error correction code.

* * * * *